(12) United States Patent
Park et al.

(10) Patent No.: US 12,477,920 B2
(45) Date of Patent: Nov. 18, 2025

(54) DISPLAY DEVICE AND METHOD FOR MANUFACTURING SAME

(71) Applicant: Samsung Display Co., Ltd., Yongin-si (KR)

(72) Inventors: Keunyoung Park, Suwon-si (KR); Youngmin Kim, Asan-si (KR); Hyeong Gyu Kim, Hwaseong-si (KR); Hyunwoo Noh, Yongin-si (KR); Moonjung Baek, Seoul (KR); Suji Han, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 622 days.

(21) Appl. No.: 17/891,145

(22) Filed: Aug. 19, 2022

(65) Prior Publication Data
US 2023/0138267 A1    May 4, 2023

(30) Foreign Application Priority Data
Nov. 1, 2021  (KR) .................... 10-2021-0147706

(51) Int. Cl.
*H10K 59/38* (2023.01)
*H10K 50/856* (2023.01)
(Continued)

(52) U.S. Cl.
CPC .......... *H10K 59/38* (2023.02); *H10K 50/856* (2023.02); *H10K 50/858* (2023.02); *H10K 71/00* (2023.02);
(Continued)

(58) Field of Classification Search
None
See application file for complete search history.

(56) References Cited

U.S. PATENT DOCUMENTS

| 9,673,263 B2 | 6/2017 | Ono et al. |
| 2015/0124188 A1 | 5/2015 | Kadowaki et al. |
| (Continued) | | |

FOREIGN PATENT DOCUMENTS

| CN | 113937237 A | * | 1/2022 | ......... H10K 59/8792 |
| EP | 3955307 A1 | * | 2/2022 | ......... H10K 59/8792 |
| (Continued) | | | | |

*Primary Examiner* — Michael Lebentritt
(74) *Attorney, Agent, or Firm* — CANTOR COLBURN LLP

(57) ABSTRACT

A display device includes a display panel that includes a first light emitting region and a second light emitting region, each of which emits first color. A first partition wall is disposed on the display panel, which allows the first color light to be transmitted therethrough, and which has a first opening defined therein and that corresponds to the first light emitting region. A first light conversion pattern is disposed inside the first opening and converts the first color light into second color light having different color. A reflection pattern is disposed corresponding to an outer surface of the first partition wall and a top surface of the first partition. An organic material pattern is disposed on the top surface of the first partition wall and overlaps the reflection pattern. A first color filter is disposed on the first light conversion pattern and allows the second color light to be transmitted therethrough.

20 Claims, 21 Drawing Sheets

(51) Int. Cl.
  *H10K 50/858* (2023.01)
  *H10K 59/12* (2023.01)
  *H10K 59/122* (2023.01)
  *H10K 71/00* (2023.01)
(52) U.S. Cl.
  CPC ....... *H10K 59/1201* (2023.02); *H10K 59/122* (2023.02)

(56) References Cited

U.S. PATENT DOCUMENTS

| | | | |
|---|---|---|---|
| 2020/0152704 A1 | 5/2020 | Jang et al. | |
| 2022/0328581 A1* | 10/2022 | Kim | H10K 59/122 |
| 2023/0178583 A1* | 6/2023 | Lee | H10H 20/84 |
| | | | 257/89 |
| 2024/0334775 A1* | 10/2024 | Jin | H10K 59/38 |

FOREIGN PATENT DOCUMENTS

| | | | | |
|---|---|---|---|---|
| JP | 2015-148638 | | 8/2015 | |
| KR | 10-1699191 | | 1/2017 | |
| KR | 10-2020-0054423 | | 5/2020 | |
| KR | 20200121430 A | * | 10/2020 | ........... H10K 59/875 |
| KR | 20200135727 A | * | 12/2020 | ........... H10K 50/865 |
| KR | 20220002798 A | * | 1/2022 | ........... H10H 29/142 |
| KR | 20230035168 A | * | 3/2023 | ............. G02B 5/223 |
| KR | 20230058240 A | * | 5/2023 | ............. H10K 59/38 |
| WO | WO-2020235838 A1 | * | 11/2020 | ............. G02B 5/201 |
| WO | WO-2024063470 A1 | * | 3/2024 | ......... H10K 59/8792 |

* cited by examiner

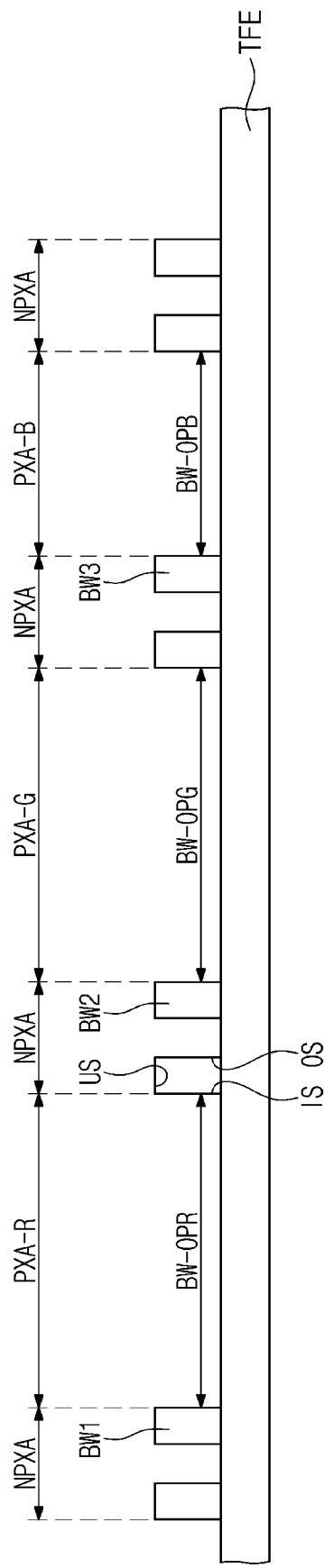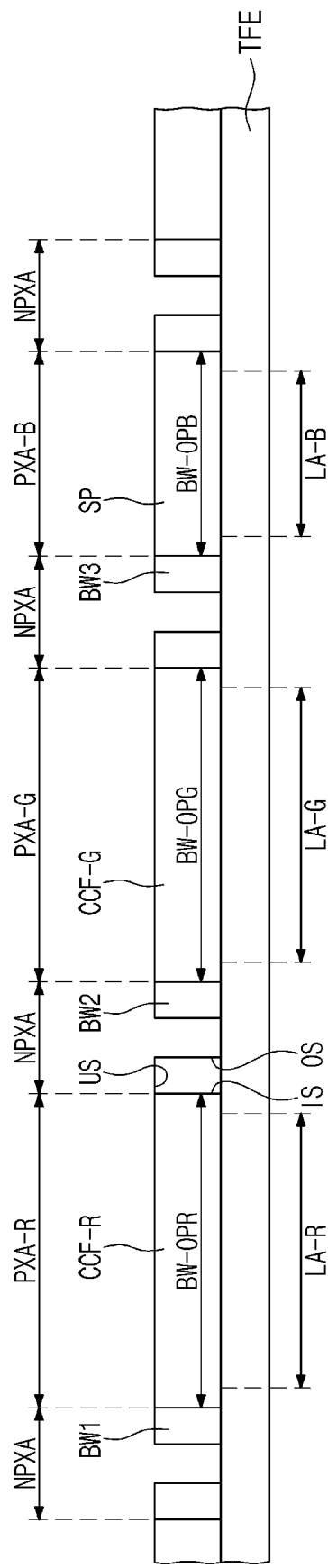

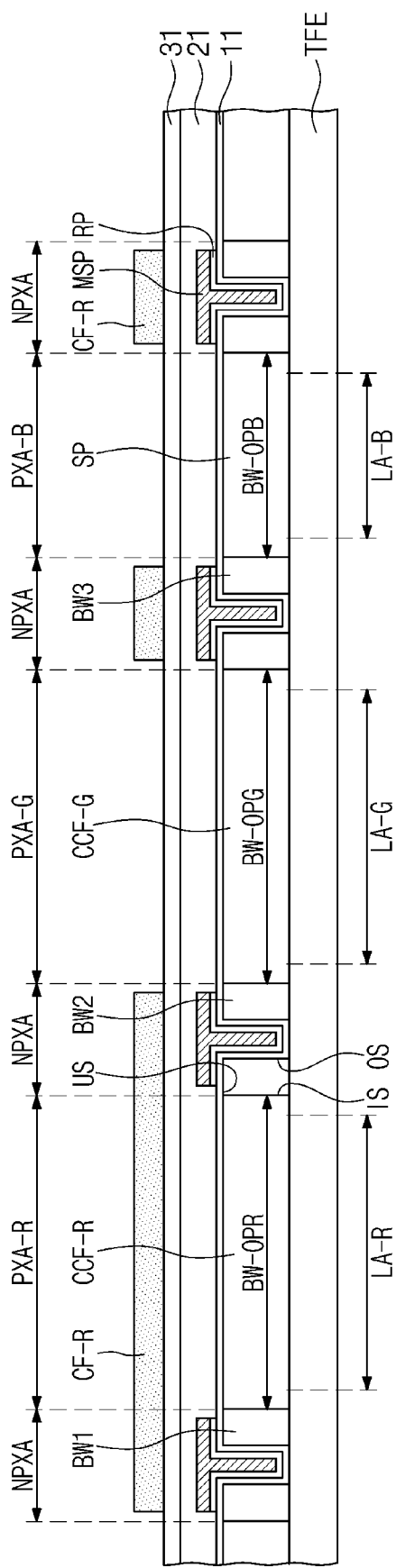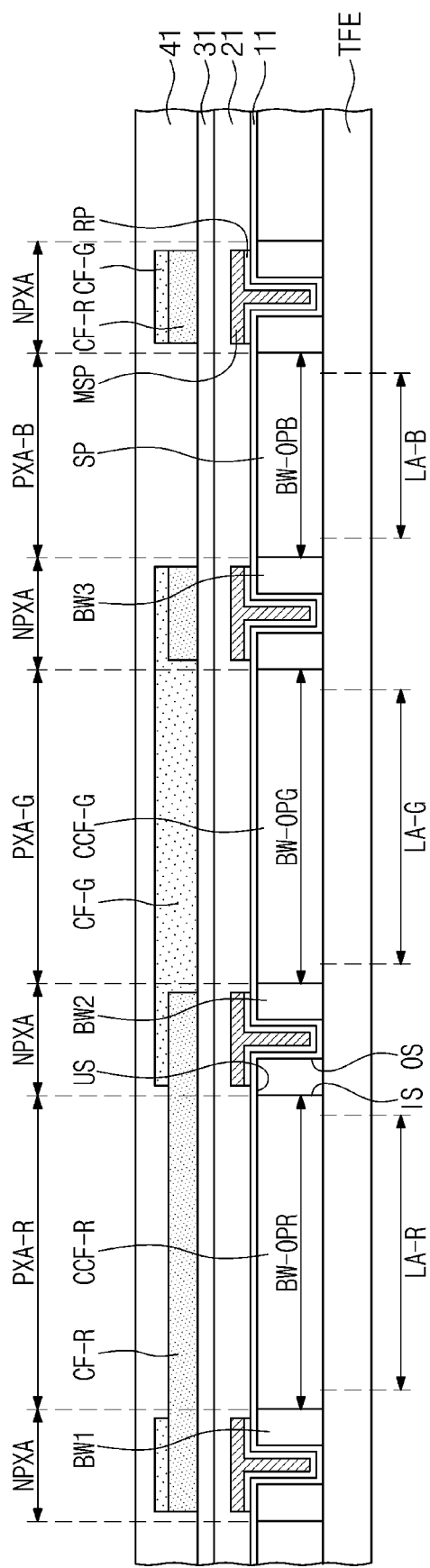

DISPLAY DEVICE AND METHOD FOR MANUFACTURING SAME

CROSS REFERENCE TO RELATED APPLICATION

This application claims priority from and the benefit of Korean Patent Application No. 10-2021-0147706, filed on Nov. 1, 2021, which is hereby incorporated by reference for all purposes as if fully set forth herein.

BACKGROUND

Field

Embodiments of the invention relate generally to a display device and a method for manufacturing the same, and more particularly, to a display device including a reflection pattern and a method for manufacturing the same.

Discussion of the Background

Display devices include transmissive display devices that allow source light generated from light sources to selectively pass therethrough and emissive display devices that generate source light by themselves. In order to generate images, the display devices may include different types of functional patterns depending on pixels. The functional patterns may allow only a specific range of wavelengths of source light to pass therethrough, or convert the color of the source light.

The above information disclosed in this Background section is only for understanding of the background of the inventive concepts, and, therefore, it may contain information that does not constitute prior art.

SUMMARY

Inventive concepts consistent with one or more embodiments provide for a display device having enhanced light emitting efficiency.

Inventive concepts consistent with one or more embodiments also provide for a method of manufacturing a display device.

Additional features of the inventive concepts will be set forth in the description that follows, and in part will be apparent from the description, or may be learned by practice of the inventive concepts.

An embodiment provides a display device that includes: a display panel that includes a first light emitting region and a second light emitting region, each of which emits first color light; a first partition wall that is disposed on the display panel, allows the first color light to be transmitted therethrough, and has a first opening defined therein and corresponding to the first light emitting region; a first light conversion pattern that is disposed inside the first opening and converts the first color light into second color light having different color; a reflection pattern disposed that corresponds to an outer surface of the first partition wall and a top surface of the first partition wall; an organic material pattern disposed on the top surface of the first partition wall and that overlaps the reflection pattern; and a first color filter disposed on the first light conversion pattern and that allows the second color light to be transmitted therethrough.

In an embodiment, the organic material pattern may include a base resin and dye or pigment mixed in the base resin.

In an embodiment, the dye or pigment may have the first color.

In an embodiment, the organic material pattern may include an organic material and scattering particles mixed in the organic material.

In an embodiment, the display device may further include an insulating layer disposed between the first light conversion pattern and the first color filter. A refractive index of the insulating layer may be about 1.1 to about 1.5.

In an embodiment, the display device may further include an inorganic layer disposed between the first light conversion pattern and the first color filter and between the first partition wall and the first color filter. The inorganic layer may be in contact with the first light conversion pattern and the first partition wall.

In an embodiment, an edge of the organic material pattern may be aligned with an edge of the reflection pattern.

In an embodiment, when viewed in a plan view, the reflection pattern may surround the first opening.

In an embodiment, the reflection pattern may include aluminum.

In an embodiment, the display device may further include: a second partition wall that is disposed on the display panel, allows the first color light to be transmitted therethrough, and has a second opening defined therein and that corresponds to the second light emitting region; a second light conversion pattern that is disposed inside the second opening and converts the first color light into third color light having different color; and a second color filter disposed on the second light conversion pattern and that allows the third color light to be transmitted therethrough. The reflection pattern may be further disposed on an outer surface of the second partition wall, which faces the outer surface of the first partition wall, and a top surface of the second partition wall, and the organic material pattern may be further disposed on the top surface of the second partition wall.

In an embodiment, the organic material pattern may be disposed between a first region of the reflection pattern, which is disposed on the outer surface of the first partition wall, and a second region of the reflection pattern, which is disposed on the outer surface of the second partition wall.

In an embodiment, the reflection pattern may fill a space defined by the outer surface of the first partition wall and the outer surface of the second partition wall.

In an embodiment, the first color filter and the second color filter may overlap each other on the organic material pattern.

In an embodiment, the display device may include: a second partition wall that is disposed on the display panel, allows the first color light to be transmitted therethrough, and has a second opening defined therein and that corresponds to the second light emitting region; and a light control pattern that is disposed inside the second opening and includes scattering particles that scatter the first color light. The reflection pattern may be further disposed on an outer surface of the second partition wall, which faces the outer surface of the first partition wall, and a top surface of the second partition wall, and the organic material pattern may be further disposed on the top surface of the second partition wall.

In an embodiment, the light control pattern may include an organic material and dye or pigment mixed in the organic material. The dye or pigment may have the first color.

In an embodiment of the inventive concept, a method for manufacturing a display device includes: forming a first partition wall on a first light emitting region of a display panel that emits first color light, wherein the first partition wall has a first opening defined therein and that corresponds to the first light emitting region; forming a first light conversion pattern inside the first opening, wherein the first light conversion pattern converts the first color light into second color light having different color; forming a reflection layer to correspond to a top surface of the first light conversion pattern, an outer surface of the first partition wall, and a top surface of the first partition wall; and forming a mask pattern to overlap a first region of the reflection layer that corresponds to the outer surface of the first partition wall and a second region of the reflection layer corresponding to the top surface of the first partition wall; and etching the reflection layer by using the mask pattern so that a reflection pattern is formed from the reflection layer.

In an embodiment, prior to forming the reflection layer, the method may further include forming an inorganic layer, which is in contact with the top surface of the first light conversion pattern, the top surface of the first partition wall, and the outer surface of the first partition wall.

In an embodiment, the method further include forming a color filter to overlap the first light conversion pattern, wherein the color filter allows the second color light to be transmitted therethrough.

In an embodiment, the method may further include forming an insulating layer to overlap the first light conversion pattern, wherein the insulating layer has a refractive index of about 1.1 to about 1.5.

In an embodiment, the mask pattern may include an organic material and dye or pigment mixed in the organic material.

In an embodiment, the mask pattern may include an organic material and scattering particles mixed in the organic material.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIGS. 8A to 8I are cross-sectional views illustrating a method for manufacturing a display device according to an embodiment.

DETAILED DESCRIPTION

Figure 1:
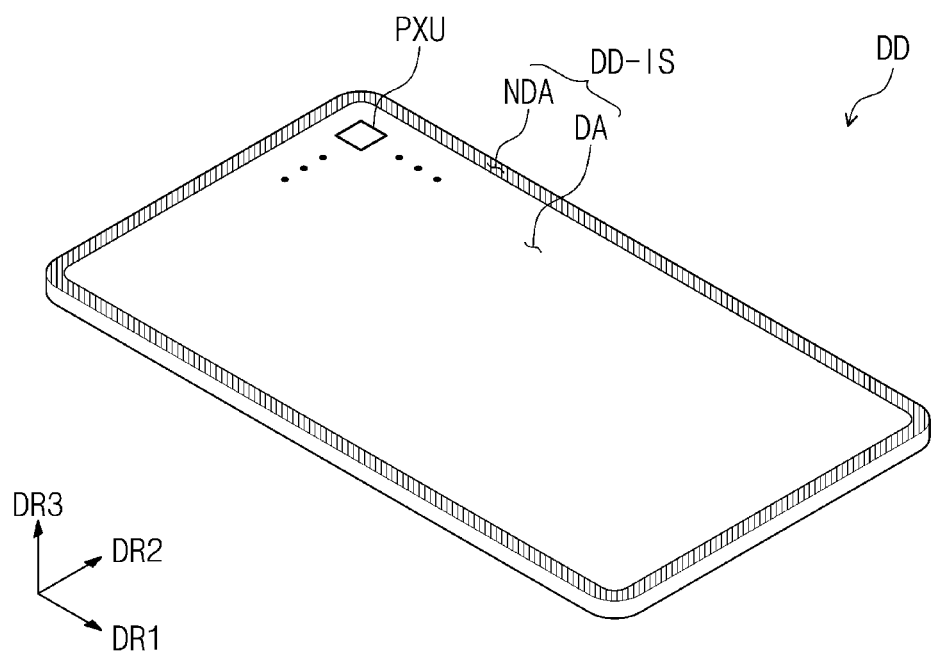
FIG. 1 is a perspective view of a display device according to an embodiment that is constructed according to principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be described with reference to the drawings.

Figure 2:
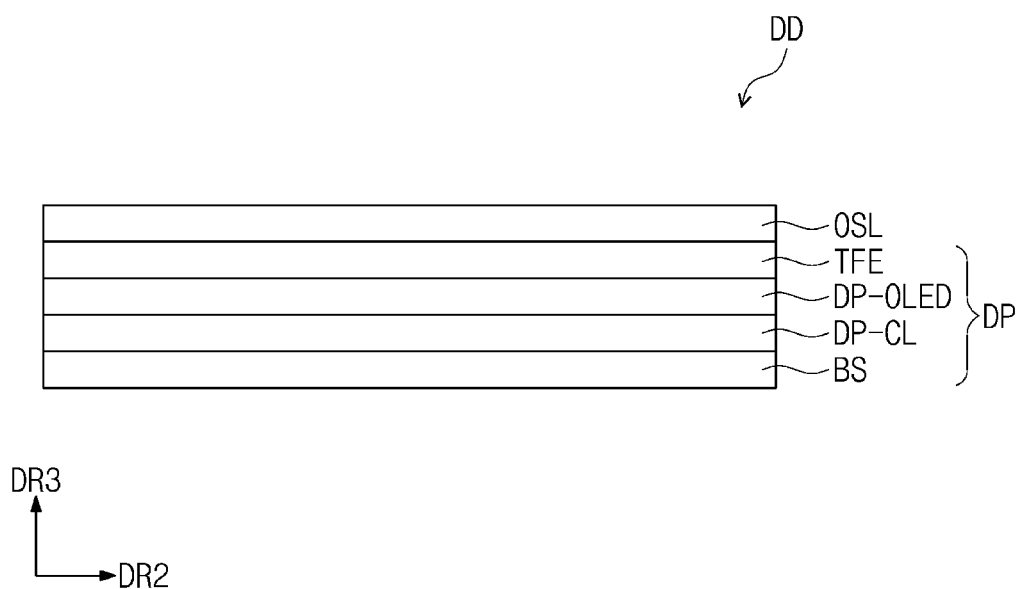
FIG. 2 is a cross-sectional view of a display device according to an embodiment.

FIG. 1 is a perspective view of a display device DD according to an embodiment that is constructed according to principles of the invention. FIG. 2 is a cross-sectional view of a display device DD according to an embodiment.

Referring to FIG. 1, the display device DD may display an image through a display surface DD-IS. The display surface DD-IS is parallel to a plane defined by a first direction DR1 and a second direction DR2. The top surface of a member disposed on the uppermost side of the display device DD may be defined as the display surface DD-IS.

A normal direction of the display surface DD-IS, that is, a thickness direction of the display device DD is indicated as a third direction DR3. A front surface (or a top surface) and a rear surface (or a bottom surface) of each layer or each unit to be described below are distinguished by the third direction DR3.

The display device DD may include a display region DA and a non-display region NDA. Unit pixels PXU are disposed in the display region DA, but the unit pixels PXU are not disposed in the non-display region NDA. The non-display region NDA is defined along an edge of the display surface DD-IS. The non-display region NDA may surround the display region DA. In an embodiment, the non-display region NDA may be omitted or disposed on only one side of the display region DA. FIG. 1 illustrates a planar display device DD, but the display device DD may have a curved shape and may roll and slide from a housing.

The unit pixels PXU illustrated in FIG. 1 may define pixel columns and pixel rows. A unit pixel PXU is the smallest repeating unit, and the unit pixel PXU may include at least one pixel. The unit pixel PXU may include a plurality of pixels that provide light having different colors.

Referring to FIG. 2, the display device DD according to an embodiment may include a display panel DP and a light control layer OSL. A protective film, a window, or a functional coating layer, which provides the front surface of the display device DD, may be additionally disposed on the light control layer OSL.

The display panel DP includes a base layer BS, a circuit element layer DP-CL disposed on the base layer BS, a display element layer DP-OLED, and a thin film encapsulation layer TFE. The base layer BS may include a synthetic resin film. The synthetic resin layer may include thermosetting resin. In particular, the synthetic resin layer may be a polyimide-based resin layer, but the material thereof is not particularly limited. The synthetic resin layer may include at least one of an acryl-based resin, a methacryl-based resin, polyisoprene, a vinyl-based resin, an epoxy-based resin, a urethane-based resin, a cellulose-based resin, a siloxane-based resin, a polyamide-based resin, or a perylene-based resin. In addition, the base layer may include a glass substrate, a metal substrate, an organic/inorganic composite material substrate, and the like.

The circuit element layer DP-CL may include a driving circuit of a pixel or a signal line. The display element layer DP-OLED includes a light emitting element disposed in each of the pixels. The light emitting element may include an organic light emitting diode or an inorganic light emitting diode, or a nano LED or micro LED. The thin film encapsulation layer TFE includes at least one inorganic layer or organic layer that seals the light emitting element.

The light control layer OSL may convert optical properties of source light generated in the light emitting element. The light control layer OSL may include a light conversion pattern for converting the source light into light having different color and a scattering pattern for scattering the source light.

Figure 3:
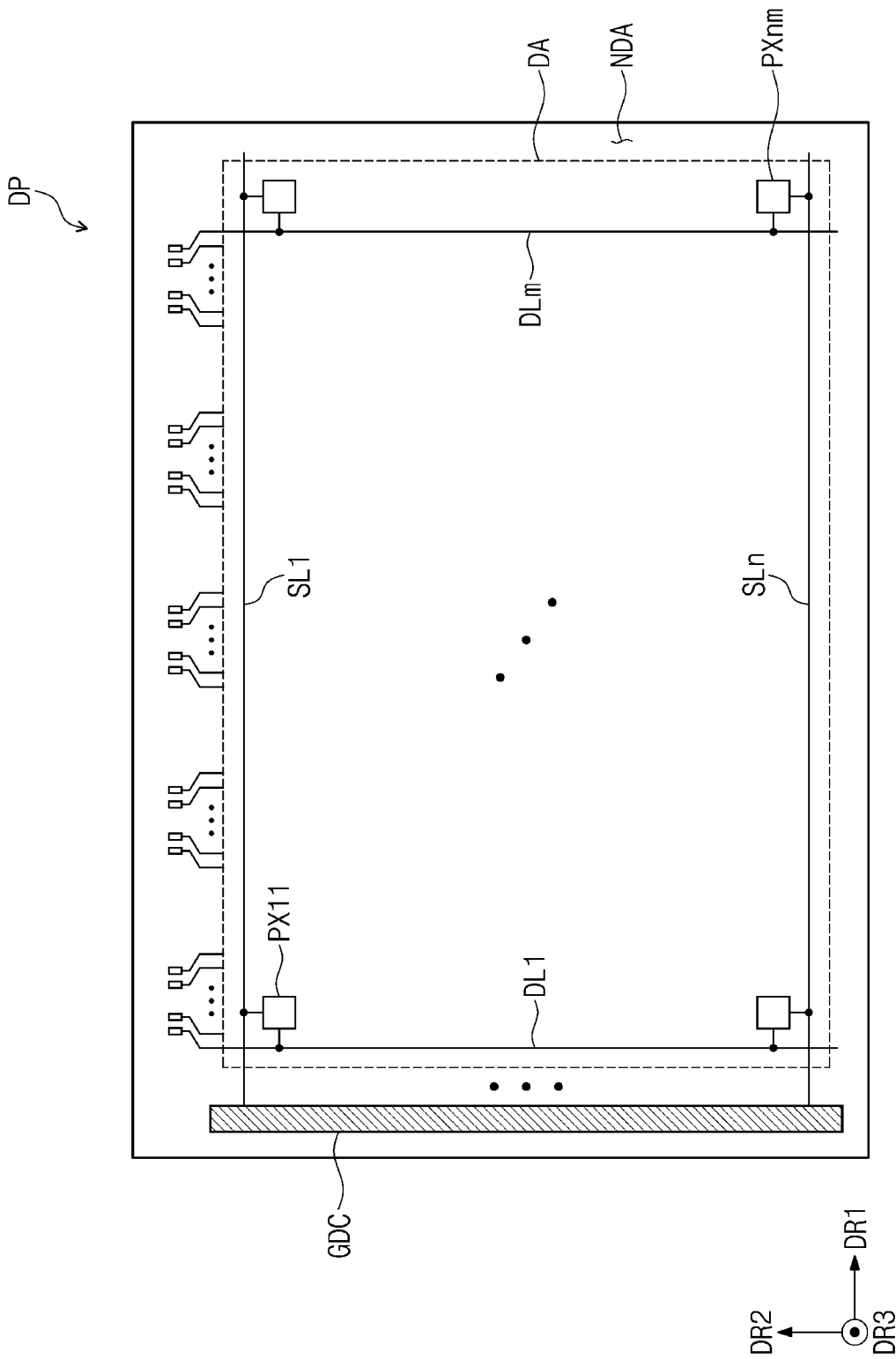
FIG. 3 is a plan view of a display panel according to an embodiment.
Figure 4:
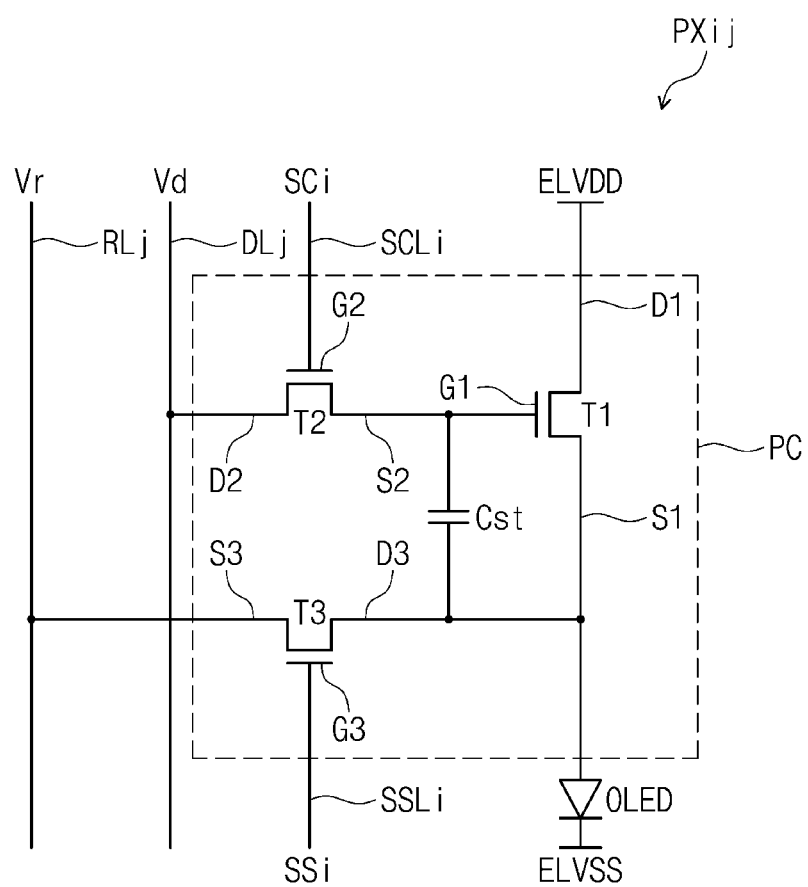
FIG. 4 is an equivalent circuit diagram of a pixel according to an embodiment.

FIG. 3 is a plan view of the display panel DP according to an embodiment. FIG. 4 is an equivalent circuit diagram of a pixel PXij according to an embodiment.

FIG. 3 illustrates a planar arrangement relationship of signal lines SL1 to SLn and DL1 to DLm and pixels PX11 to PXnm that are included in the display panel DP. The signal lines SL1 to SLn and DL1 to DLm may include a plurality of scan lines SL1 to SLn and a plurality of data lines DL1 to DLm.

Each of the pixels PX11 to PXnm is connected to a corresponding scan line among the plurality of scan lines SL1 to SLn and a corresponding data line among the plurality of data lines DL1 to DLm. Each of the pixels PX11 to PXnm may include a pixel driving circuit and a light emitting element. More various types of signal lines may be provided in the display panel DP according to the configuration of the pixel driving circuits of the pixels PX11 to PXnm.

The display region DA and the non-display region NDA of the display device DD illustrated in FIG. 1 may be defined even in the display panel DP in the same manner. The pixels PX11 to PXnm are arranged in the display region DA, and a gate driving circuit GDC is disposed in the non-display region NDA. A plurality of pixels among the pixels PX11 to PXnm constitute one group and are repeatedly arranged. This group represents the unit pixel PXU illustrated in FIG. 1.

FIG. 4 illustrates a pixel PXij which is connected to an i-th scan line SCLi, an i-th sensing line SSLi, a j-th data line DLj, and a j-th reference line RLj. The pixel PXij includes a pixel circuit PC and a light emitting element OLED connected to the pixel circuit PC. The pixel circuit PC may include a plurality of transistors T1 to T3 and a capacitor Cst. The plurality of transistors T1 to T3 may be formed through a low Temperature polycrystalline silicon (LTPS) process or a low temperature polycrystalline oxide (LTPO) process. Hereinafter, the plurality of transistors T1 to T3 are described as N-types, but at least one transistor may be formed as a P-type transistor.

The pixel circuit PC including a first transistor T1 (or a driving transistor), a second transistor T2 (or a switch transistor), a third transistor T3 (or a sensing transistor), and a capacitor Cst is illustrated in the embodiment, but the pixel circuit PC is not limited thereto. The pixel circuit PC may include an additional transistor or an additional capacitor.

The light emitting element OLED may be an organic light emitting element or inorganic light emitting element that includes an anode (a first electrode) and a cathode (a second electrode). The anode of the light emitting element OLED may receive first voltage ELVDD via the first transistor T1, and the cathode of the light emitting element OLED may receive second voltage ELVSS. The light emitting element OLED may receive the first voltage ELVDD and the second voltage ELVSS and emit light.

The first transistor T1 may include a drain D1 receiving the first voltage ELVDD, a source S1 connected to the anode of the light emitting element OLED, and a gate G1 connected to the capacitor Cst. In response to the voltage value stored in the capacitor Cst, the first transistor T1 may control the driving current that flows through the light emitting element OLED from the first voltage ELVDD.

The second transistor T2 may include a drain D2 connected to j-th data line DLj, a source S2 connected to the capacitor Cst, and a gate G2 receiving an i-th first scan signal SCi. The j-th data line DLj may receive a data voltage Vd. In response to the i-th first scan signal Sci, the second transistor T2 provides the data voltage Vd to the first transistor T1.

The third transistor T3 may include a source S3 connected to the j-th reference line RLj, a drain D3 connected to the anode of the light emitting element OLED, and a gate G3 receiving an i-th second scan signal SSi. The j-th reference line RLj may receive a reference voltage Vr. The third transistor T3 may initialize the capacitor Cst and the anode of the light emitting element OLED.

The capacitor Cst may store a voltage that corresponds to a difference between the voltage received from the second transistor T2 and the first voltage ELVDD. The capacitor Cst may be connected to the gate G1 of the first transistor T1 and the anode of the light emitting element OLED.

Figure 5A:
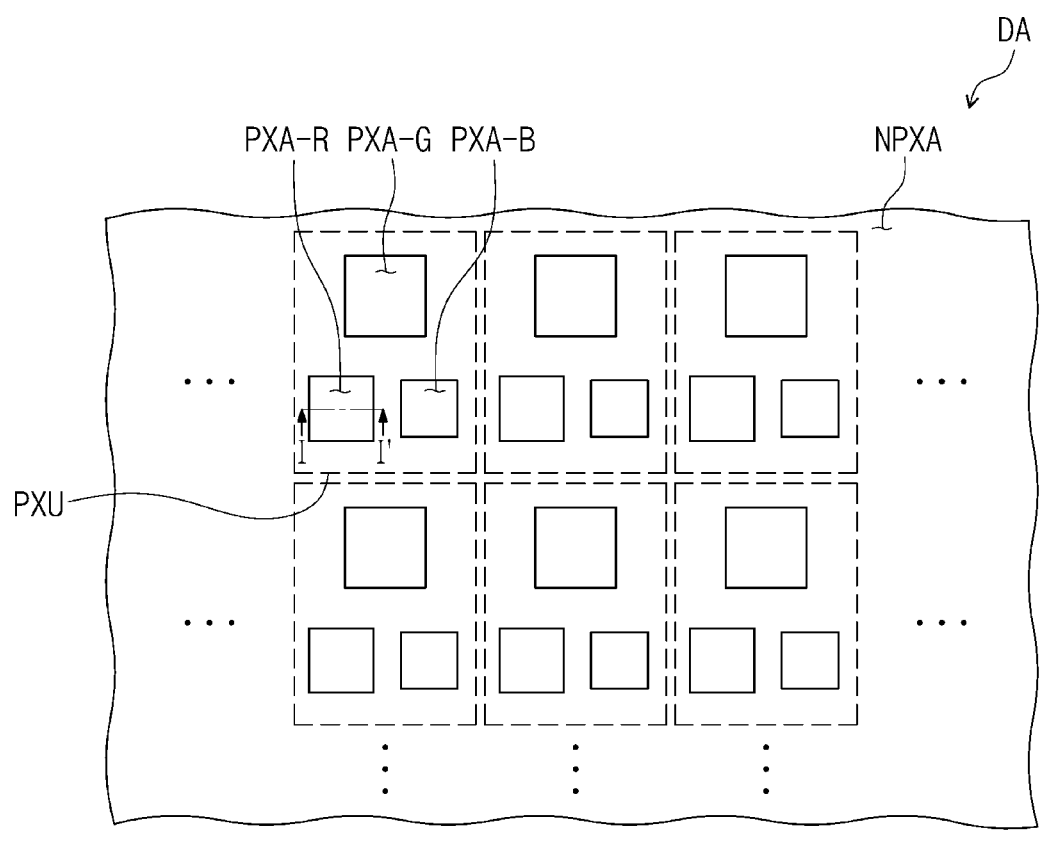
FIGS. 5A and 5B are enlarged plan views of a display region according to an embodiment.
Figure 5B:
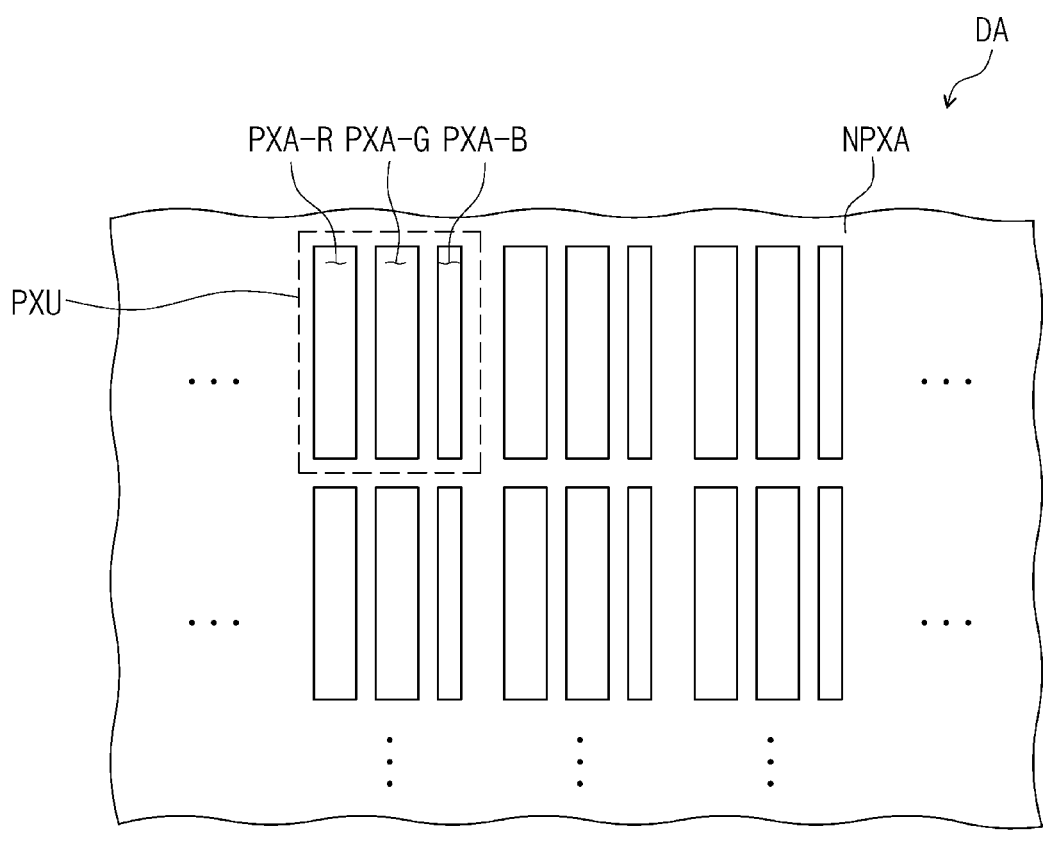

FIGS. 5A and 5B are enlarged plan views of a display region DA according to an embodiment.

As illustrated in FIGS. 5A and 5B, the unit pixels PXU are arranged in the first direction DR1 and the second direction DR2. In the embodiment, the unit pixel PXU may include a first pixel, a second pixel, and a third pixel that emit light having colors different from each other. The first pixel, the second pixel, and the third pixel may generate red light, green light, and blue light, respectively. FIGS. 5A and 5B illustrate a first pixel region PXA-R, a second pixel region PXA-G, and a third pixel region PXA-B which represent the first pixel, the second pixel, and the third pixel, respectively. A peripheral region NPXA is disposed between the first pixel region PXA-R, the second pixel region PXA-G, and the third pixel region PXA-B. The peripheral region NPXA defines boundaries of the first to third pixel regions PXA-R, PXA-G, and PXA-B and prevents color mixing between the first to third pixel regions PXA-R, PXA-G, and PXA-B.

Referring to FIG. 5A, the first pixel region PXA-R and the third pixel region PXA-B are arranged in the same row, and the second pixel region PXA-G is disposed in a different row from the first pixel region PXA-R and the third pixel region PXA-B. The second pixel region PXA-G may have the largest area, and the third pixel region PXA-B may have the smallest area. However, the embodiment is not limited thereto. The first pixel region PXA-R, the second pixel region PXA-G, and the third pixel region PXA-B having substantially rectangular shapes are illustrated in the embodiment, but the embodiment is not limited thereto. Referring to FIG. 5B, the first pixel region PXA-R, the second pixel region PXA-G, and the third pixel region PXA-B may be arranged in the same row. The first pixel region PXA-R, the second pixel region PXA-G, and the third pixel region PXA-B may have the same width within the second direction DR2.

Figure 6A:
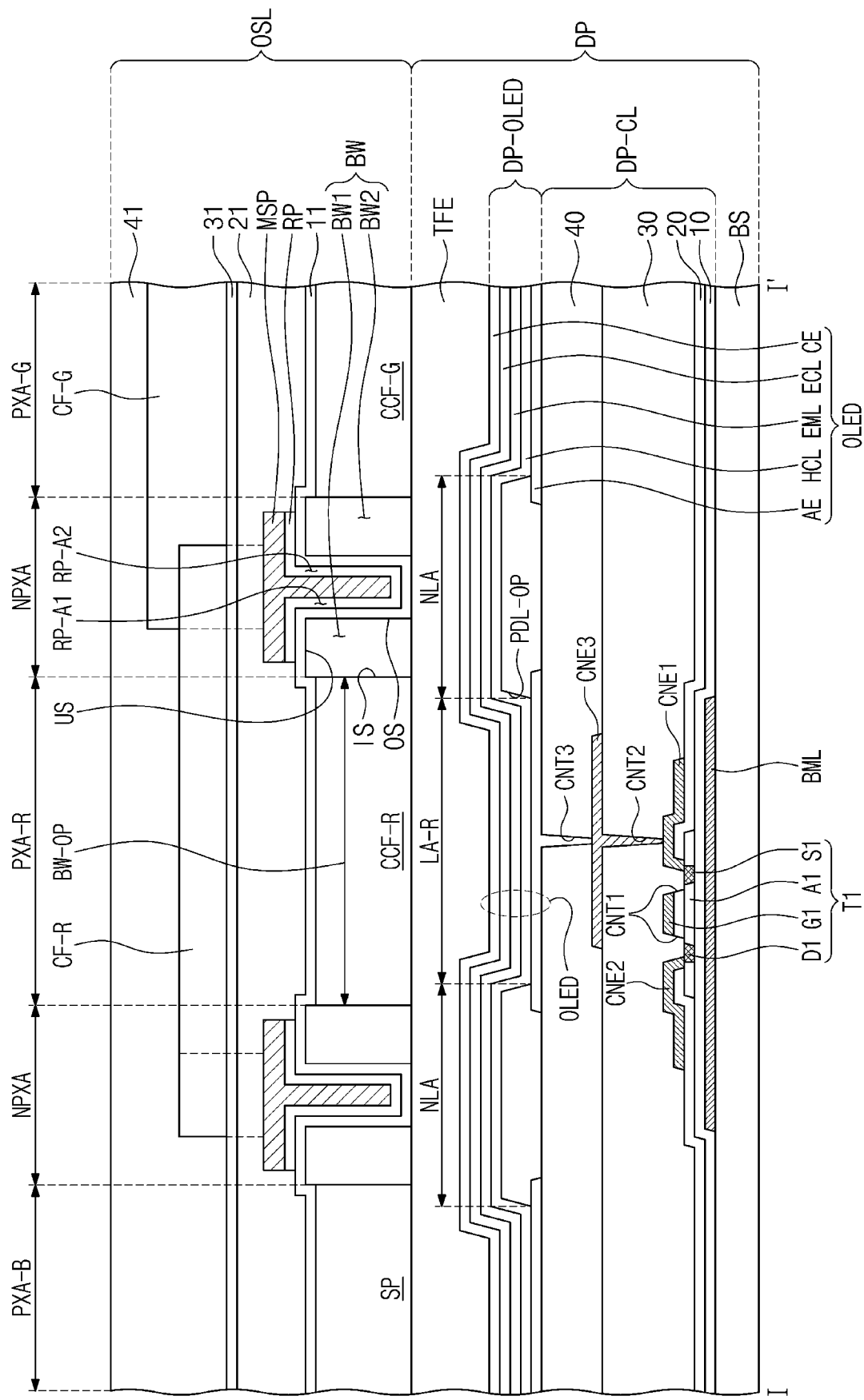
FIG. 6A is a cross-sectional view taken along line I-I' of FIG. 5A.
Figure 6B:
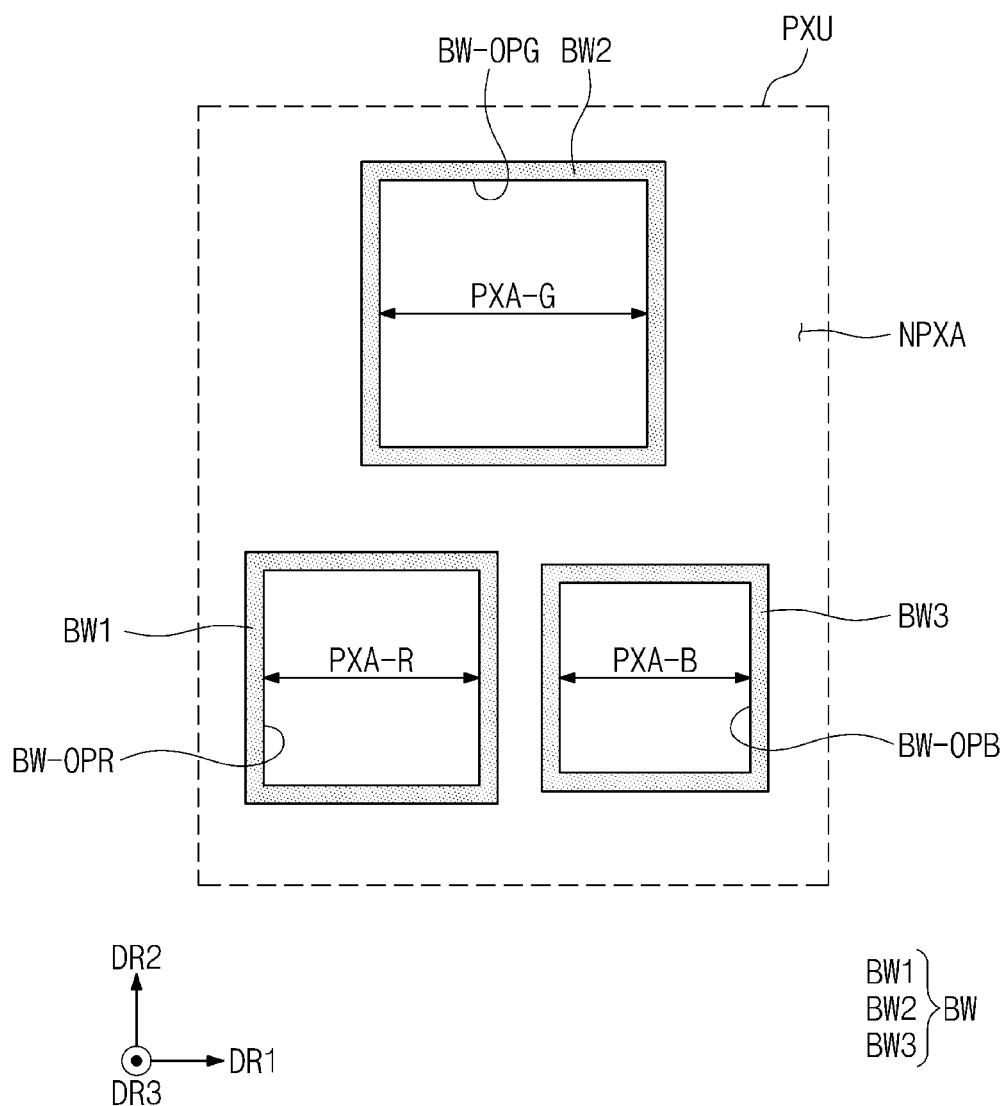
FIG. 6B is a plan view illustrating planar shapes of partition walls according to an embodiment.
Figure 6C:
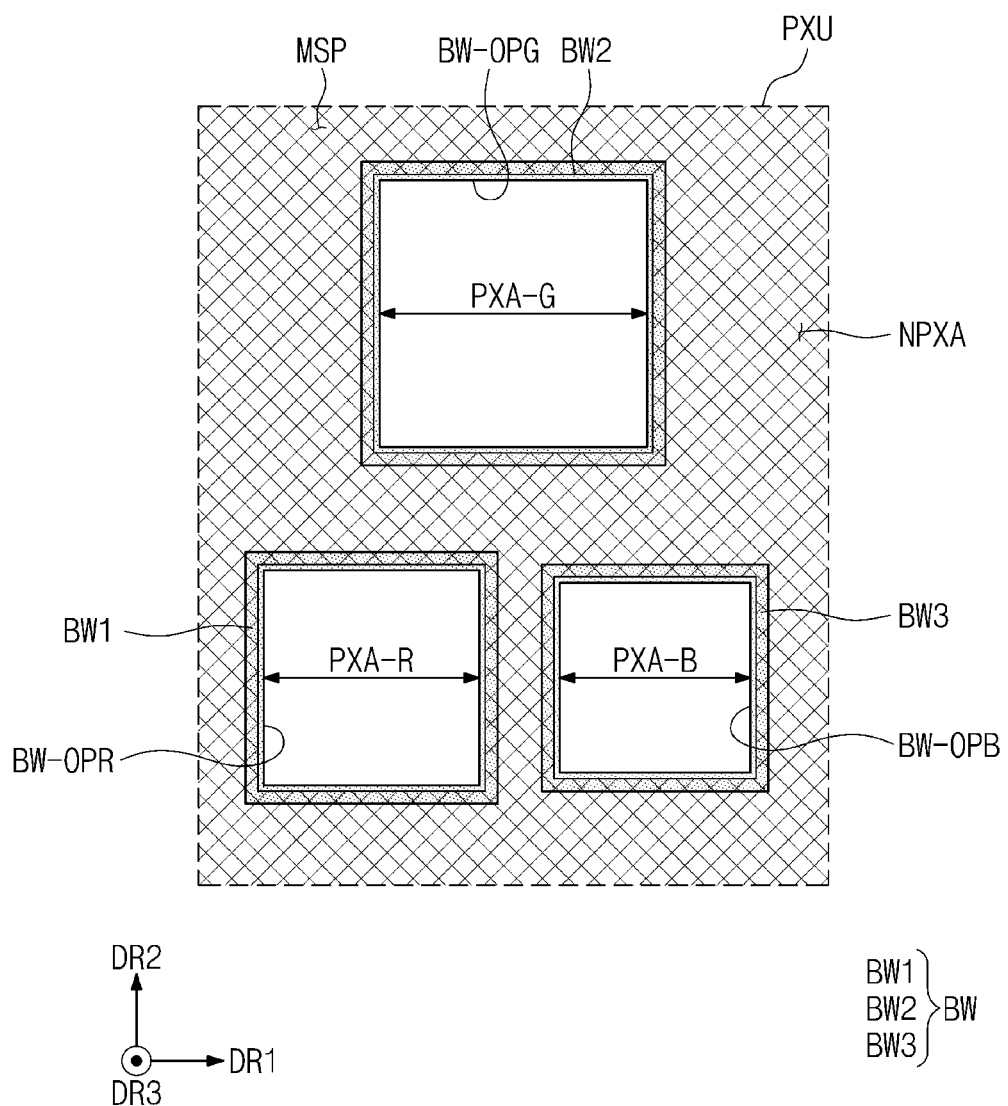
FIG. 6C is a plan view illustrating a planar shape of an organic material pattern according to an embodiment.
Figure 6D:
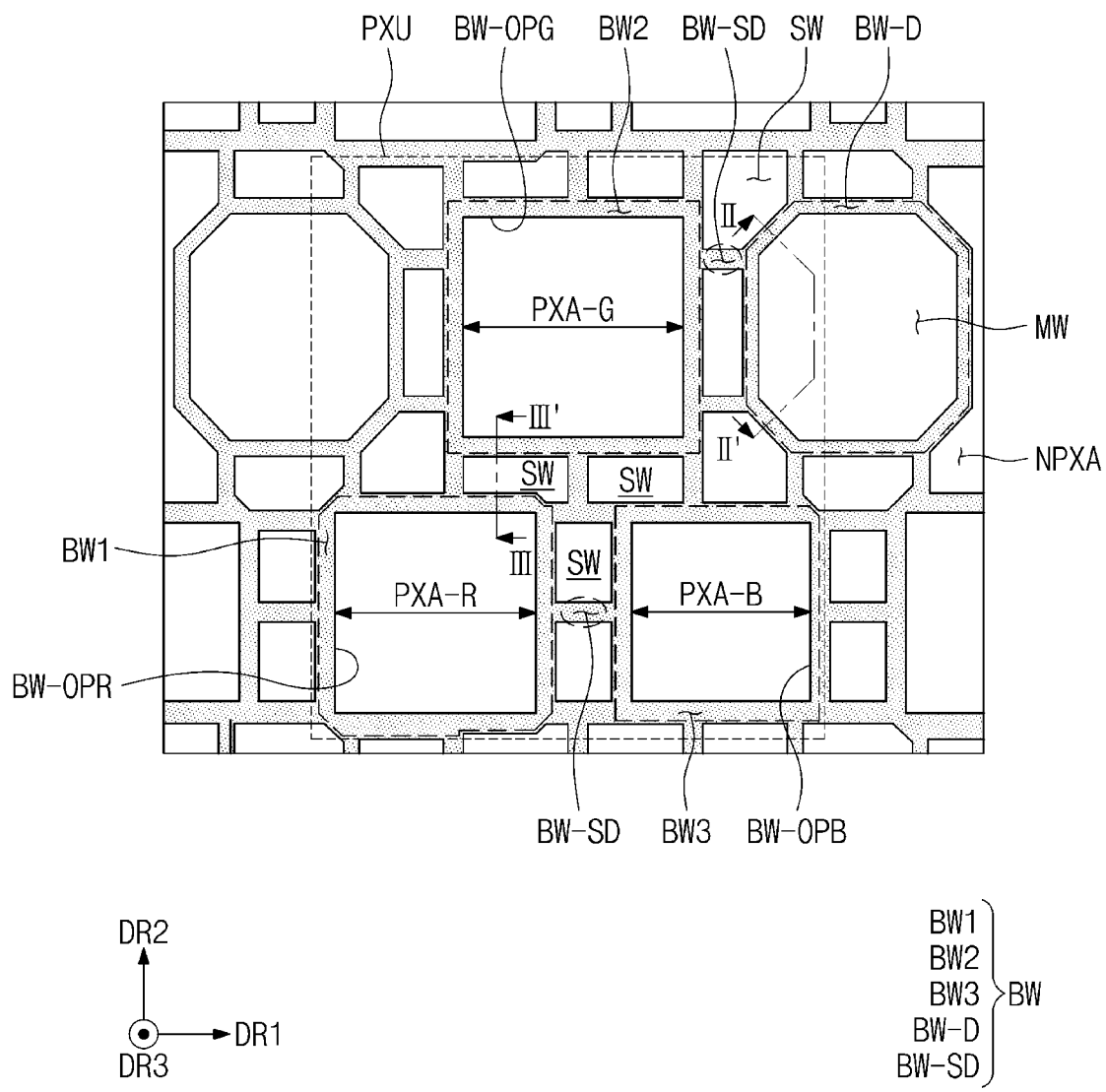
FIG. 6D is a plan view illustrating a planar shape of an partition wall according to an embodiment.
Figure 6E:
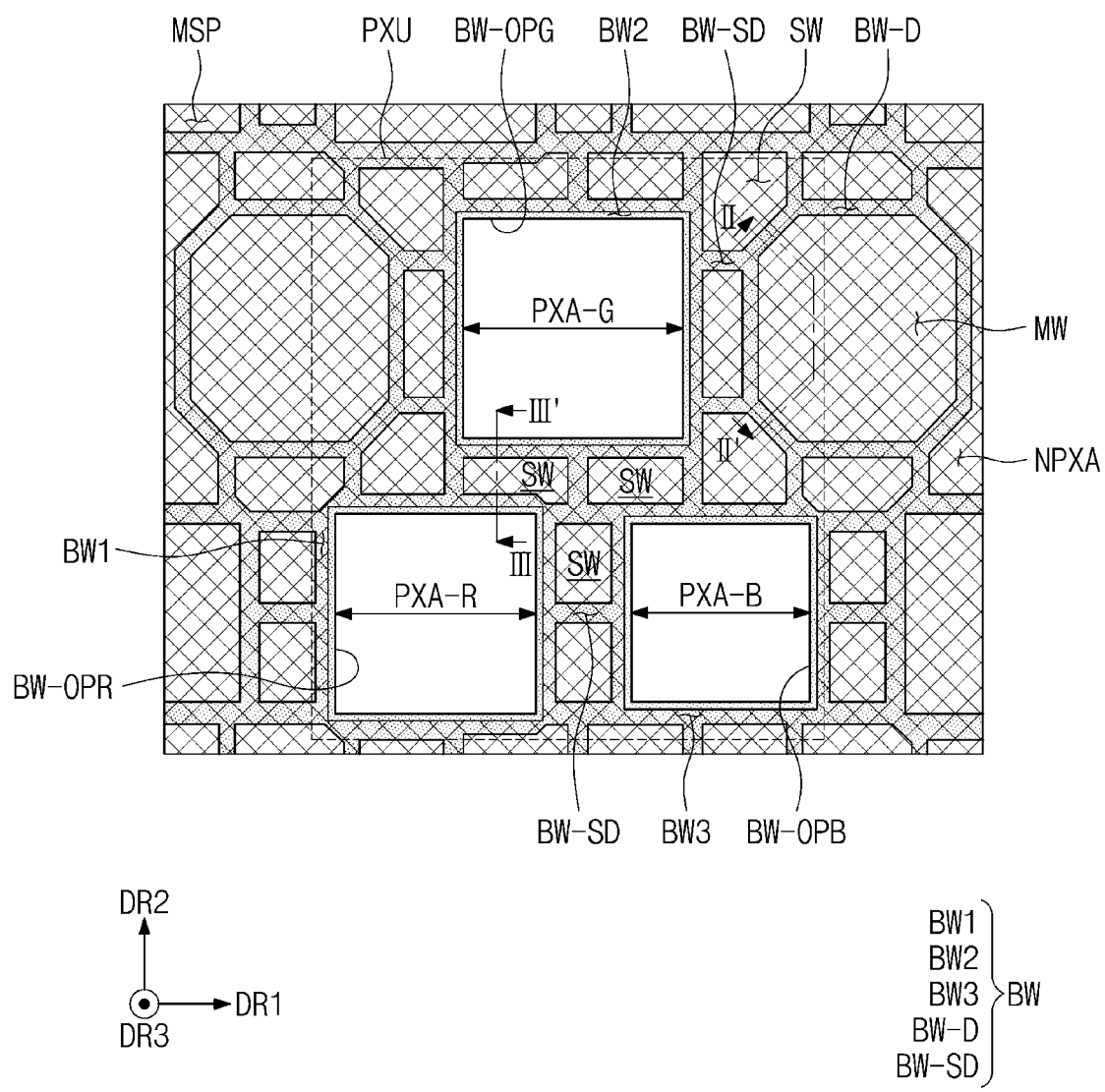
FIG. 6E is a plan view illustrating a planar shape of an organic material pattern according to an embodiment.
Figure 6F:
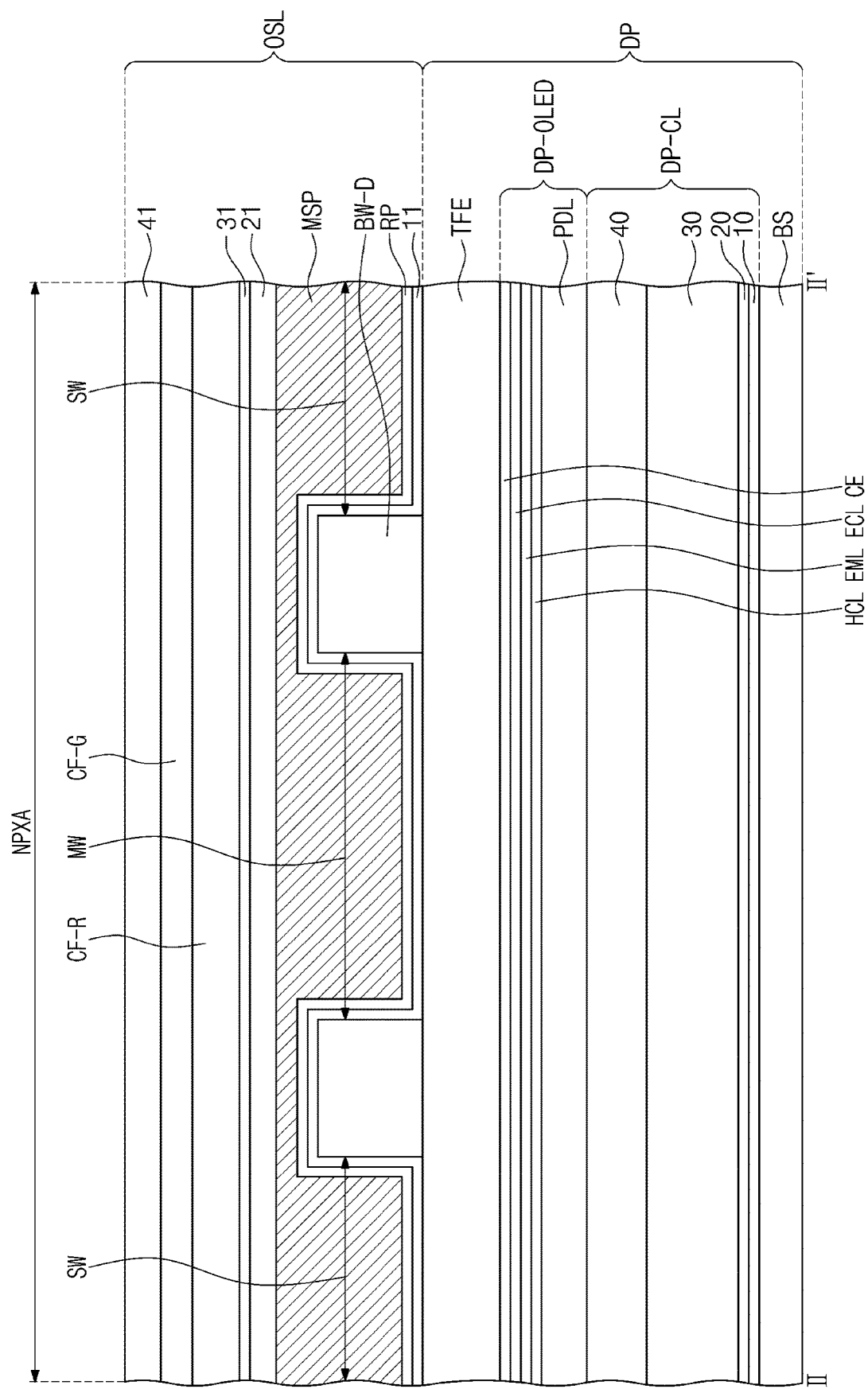
FIG. 6F is a cross-sectional view taken along line II-II' of FIG. 6E.
Figure 6G:
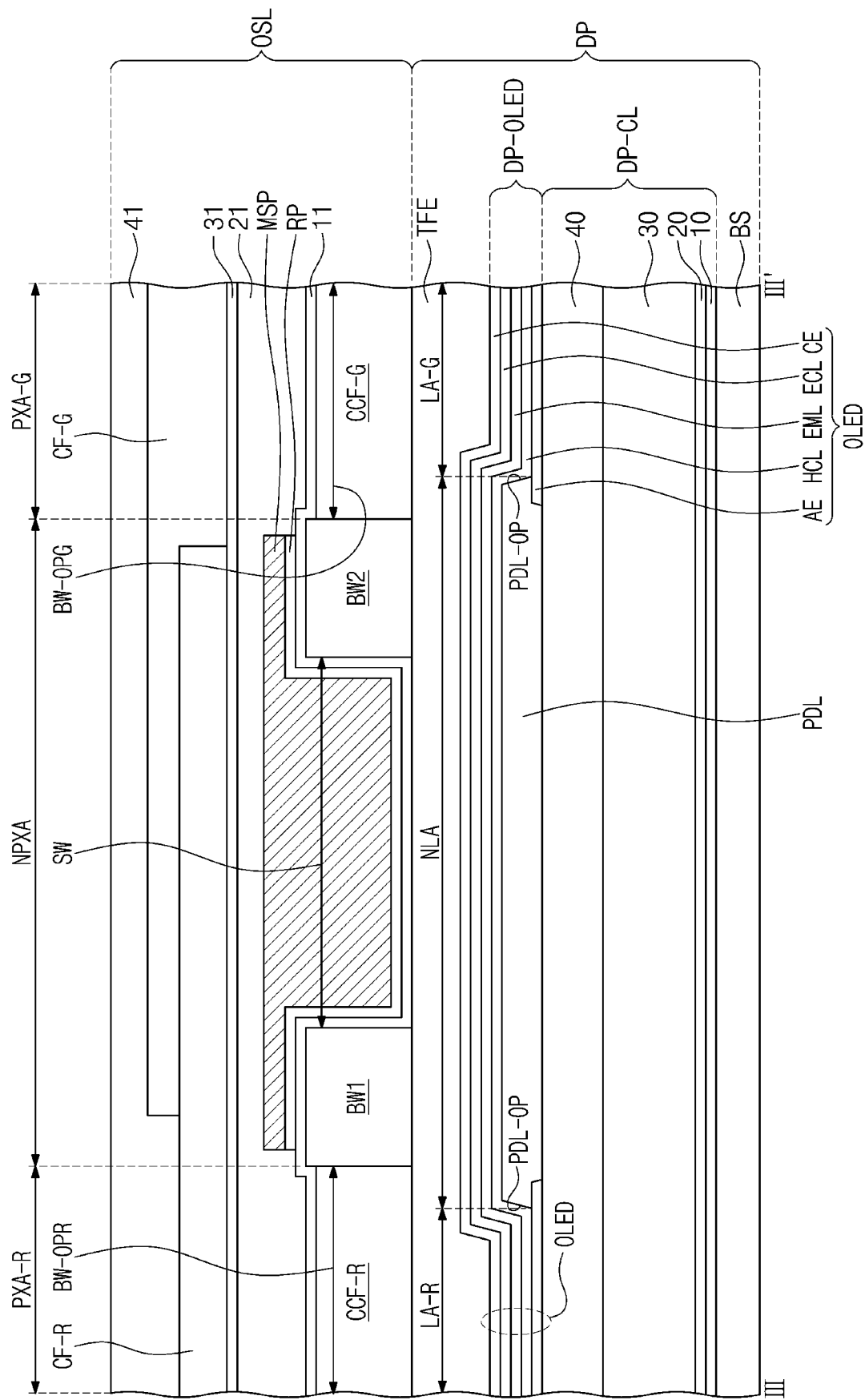
FIG. 6G is a cross-sectional view taken along line of FIG. 6E.

FIG. 6A is a cross-sectional view taken along line I-I' of FIG. 5A. FIG. 6B is a plan view illustrating planar shapes of partition walls BW1, BW2, and BW3 according to an embodiment. FIG. 6C is a plan view illustrating a planar shape of an organic material pattern MSP according to an embodiment. FIG. 6D is a plan view illustrating a planar shape of an partition wall BW according to an embodiment. FIG. 6E is a plan view illustrating a planar shape of an organic material pattern MSP according to an embodiment. FIG. 6F is a cross-sectional view taken along line II-II' of FIG. 6E. FIG. 6G is a cross-sectional view taken along line of FIG. 6E.

FIG. 6A mainly illustrates the cross-section corresponding to the first pixel region PXA-R, and illustrates the cross-section of the first transistor T1. The second pixel region PXA-G and the third pixel region PXA-B may also have the same stacking structures as the first pixel region PXA-R.

A light blocking pattern BML may be disposed on a base layer BS. The light blocking pattern BML may include a metal. A signal line may be disposed on the same layer as the light blocking pattern BML. A first insulating layer 10 covering the light blocking pattern BML may be disposed on the base layer BS.

A semiconductor pattern that overlaps the light blocking pattern BML is disposed on the first insulating layer 10. The semiconductor pattern may have different electrical properties depending on whether the semiconductor pattern is doped or not. The semiconductor pattern may include a first region having high conductivity and a second region having low conductivity. The first region may be doped with an N-type dopant or a P-type dopant. A P-type transistor may include a doped region that is doped with the P-type dopant, and an N-type transistor may include a doped region that is doped with the N-type dopant. The second region may be a non-doped region or a region doped at a lower concentration than that of the first region.

The semiconductor pattern may include a source region S1, a channel region AC1 (or an active region), and a drain region D1. A second insulating layer 20 is disposed on the first insulating layer 10. Contact holes CNT1 exposing the source region S1 and the drain region D1 are defined in the second insulating layer 20. The first insulating layer 10 and the second insulating layer 20 may be inorganic layers.

Connection electrodes CNE1 and CNE2 are arranged on the second insulating layer 20. The first connection electrode CNE1 may electrically connect the source region S1 of the first transistor T1 to the drain D3 of the third transistor T3 illustrated in FIG. 4. The second connection electrode CNE2 may electrically connect the drain region D1 of the first transistor T1 to the signal line that receives the first voltage ELVDD illustrated in FIG. 4. A signal line may receive the first voltage ELVDD.

The third insulating layer 30 is disposed on the second insulating layer 20. A third connection electrode CNE3 is disposed on the third insulating layer 30. The third connection electrode CNE3 may be connected to the first connection electrode CNE1 via a contact hole CNT2 that passes through the third insulating layer 30. A fourth insulating layer 40 is disposed on the third insulating layer 30. An anode AE is disposed on the fourth insulating layer 40. The anode AE may be connected to the third connection electrode CNE3 via a contact hole CNT3 that passes through the fourth insulating layer 40. The third insulating layer 30 and the fourth insulating layer 40 may be organic layers.

A light emitting element OLED and a pixel defining layer PDL may be arranged on the fourth insulating layer 40. At least a portion of the anode AE is exposed through an opening PDL-OP of the pixel defining layer PDL. The opening PDL-OP of the pixel defining layer PDL may define a light emitting region LA-R. A region in which the pixel defining layer PDL is disposed may be defined as a non-light emitting region NLA.

A hole control layer HCL may be disposed as a common layer in the light emitting region LA-R and the non-light emitting region NLA. The common layer such as the hole control layer HCL may be disposed overlapping the plurality of unit pixels PXU in the display region DA illustrated in FIG. 5A. The hole control layer HCL may include a hole transport layer and a hole injection layer.

A light emitting layer EML is disposed on the hole control layer HCL. The light emitting layer EML may be disposed as a common layer in the light emitting region LA-R and the non-light emitting region NLA. The light emitting layer EML may be disposed as a common layer in a plurality of light emitting region. The light emitting layer EML may generate source light. The light emitting layer EML may include an organic light emitting material or an inorganic light emitting material. In the embodiment, the source light may be blue light, and hereinafter, will be described as first color light.

An electron control layer ECL is disposed on the light emitting layer EML. The electron control layer ECL may include an electron transport layer and an electron injection layer. A cathode CE is disposed on the electron control layer ECL. A thin film encapsulation layer TFE is disposed on the cathode CE. The thin film encapsulation layer TFE is disposed in common in the plurality of pixels PX. In the embodiment, the thin film encapsulation layer TFE directly covers the cathode CE.

The thin film encapsulation layer TFE includes at least an inorganic layer or an organic layer. In an embodiment, the thin film encapsulation layer TFE may include two inorganic layers and an organic layer disposed therebetween. In an embodiment of the inventive concept, the thin film encapsulation layer may include a plurality of inorganic layers and a plurality of organic layers which are alternately stacked.

Referring to FIG. 6A, a light control layer OSL is disposed on the thin film encapsulation layer TFE. In the embodiment, the light control layer OSL is illustrated as being in contact with the inorganic layer on the uppermost side of the thin film encapsulation layer TFE, but an additional buffer layer may be further disposed between the inorganic layer on the uppermost side of the thin film encapsulation layer TFE and the light control layer OSL.

A partition wall BW (or a partition pattern) may be disposed on the thin film encapsulation layer TFE. In the embodiment, the partition wall BW may include a base resin and an additive. The base resin may be made of various resin compositions. The additive may include a coupling agent and/or a photo-initiator. The additive may further include a dispersant. The partition wall BW may include a light transmissive material through which the source light may be transmitted.

The partition wall BW is disposed within the non-light emitting region NLA. An opening BW-OP is formed in the partition wall BW. The opening BW-OP defines the first pixel region PXA-R that corresponds to the light emitting region LA-R. A partition wall BW1 defining the first pixel region PXA-R is defined as a first partition wall BW1.

A light conversion pattern CCF-R (hereinafter, referred to as a first light conversion pattern) is disposed inside the opening BW-OP. The first light conversion pattern CCF-R may be in contact with an inner surface IS of the first partition wall BW1, and may change optical properties of the source light. In the embodiment, the first light conversion pattern CCF-R may absorb the source light generated in the light emitting element OLED and then generate light having different color. In the embodiment, the light generated in the first light conversion pattern CCF-R of the first pixel region PXA-R may be second color light, and the second color light may be red color.

The first light conversion pattern CCF-R may include a base resin, quantum dots mixed (or dispersed) in the base resin, and scatterers mixed (or dispersed) in the base resin.

The quantum dots may be particles which convert an wavelength of incident light. The quantum dots are materials having crystal structures with sizes of several nanometers and are composed of several hundreds to several thousands of atoms. Also, a quantum confinement effect is exhibited in which an energy band gap increases due to small sizes thereof. When light with a wavelength having higher energy than the band gap is incident on the quantum dots, the quantum dots are excited by absorbing the light and transition to a ground state while emitting light having a specific wavelength. The energy of the emitted light has a value corresponding to the band gap. When the sizes and compositions of the quantum dots are adjusted, the light emission characteristics due to the quantum confinement effect may be controlled.

The quantum dots may be selected from the group consisting of a group II-VI compound, a group compound, a group III-V compound, a group IV-VI compound, a group IV element, a group IV compound, and a combination thereof.

The group II-VI compound may be selected from the group consisting of: a binary element compound selected from the group consisting of CdSe, CdTe, CdS, ZnS, ZnSe, ZnTe, ZnO, HgS, HgSe, HgTe, MgSe, MgS, and a mixture thereof; a ternary element compound selected from the group consisting of AgInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The group compound may be selected from: a ternary element compound selected from the group consisting of AgInS2, CuInS2, AgGaS2, CuGaS2, and a mixture thereof; or a quaternary element compound such as AgInGaS2 and CuInGaS2.

The group III-V compound may be selected from the group consisting of: a binary element selected from the group consisting of GaN, GaP, GaAs, GaSb, AlN, AlP, AlAs, AlSb, InN, InP, InAs, InSb, and a mixture thereof; a ternary element selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary element selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof. Here, the group III-V compound may further include group II metal. For example, InZnP or the like may be selected as the group III-II-V compound.

The IV-VI compound may be selected from the group consisting of: a binary element compound selected from the group consisting of SnS, SnSe, SnTe, PbS, PbSe, PbTe, and a mixture thereof; a ternary element compound selected from the group consisting of SnSeS, SnSeTe, SnSTe, PbSeS, PbSeTe, PbSTe, SnPbS, SnPbSe, SnPbTe, and a mixture thereof; and a quaternary element compound selected from the group consisting of SnPbSSe, SnPbSeTe, SnPbSTe, and a mixture thereof. The group IV element may be selected from the group consisting of Si, Ge, and a mixture thereof. The group IV compound may be a binary element compound selected from the group consisting of SiC, SiGe, and a mixture thereof.

Here, the binary element compound, the ternary element compound, or the quaternary element compound may exist in particles at a uniform concentration, or in the same particle while being divided to have partially different concentration distributions.

The quantum dots may have a core-shell structure including a core and a shell surrounding the core. In addition, it is possible to have a core/shell structure in which one quantum dot surrounds another quantum dot. The interface between the core and shell may have a concentration gradient in which the concentration of elements present in the shell is gradually reduced toward the core.

The quantum dots may be particles having nanometer-scale sizes. The quantum dots may have a full width at half maximum (FWHM) of a light emission wavelength spectrum of about 45 nm or less, preferably about 40 nm or less, and more preferably about 30 nm or less, and in this range, color purity and color reproducibility may be improved. Also, light emitted through such quantum dots is emitted in all directions, so that an optical viewing angle may be improved.

In addition, the quantum dots have shapes which are commonly used in related fields and are not particularly limited. However, more specifically, shapes such as spherical shapes, pyramidal shapes, multi-arm shapes, cubic nanoparticles, nanotubes, nanowires, nanofibers, and nano plate-like particles may be used. The quantum dots may regulate color of the emitted light according to particle sizes, and accordingly, the quantum dots may have various light emission colors such as red light, green light, and blue light.

The base resin may be a medium in which quantum dots are dispersed, and may include various resin compositions which may be generally referred to as a binder. However, the embodiment is not limited thereto, and in the present specification, any medium capable of dispersing and arranging the quantum dots may be referred to as a base resin regardless of its name, additional other functions, constituent materials, and the like. The base resin may be a polymer resin. For example, the base resin may be an acrylic-based resin, a urethane-based resin, a silicon-based polymer, an epoxy-based resin, and the like. The base resin may be a transparent resin.

The scatterers scatter the light generated in the light conversion pattern or the light passing through the light conversion pattern. The scatterers may be particles that have relatively greater density or specific gravity. The scattering particles may include titanium oxide (TiO2) particles, silica-based nanoparticles, or the like.

A first insulating layer 11 of the light control layer OSL, which covers the first partition wall BW1 and the first light conversion pattern CCF-R, is disposed on the thin film encapsulation layer TFE. The first insulating layer 11 may be an inorganic layer that seals the first partition wall BW1 and the first light conversion pattern CCF-R. In an embodiment of the inventive concept, the first insulating layer 11 may be omitted.

A reflection pattern RP may be disposed corresponding to an outer surface OS of the first partition wall BW1 and a top surface US of the first partition wall BW1. The reflection pattern RP may include a metal. The reflection pattern RP may include a metal having relatively high reflectance, such as aluminum. The boundaries between the side surfaces IS and OS of the first partition wall BW1 and the top surface US of the first partition wall BW1 may be unclear. So, a region of the surface of the first partition wall BW1, which faces the base layer BS, is defined as the top surface US, and a region, which is inclined to the base layer BS in the cross-section and is not in contact with the first light conversion pattern CCF-R, may be defined as the outer surface OS. A region, which is inclined to the base layer BS in the cross-section and is in contact with the first light conversion pattern CCF-R, may be defined as the inner surface IS.

The reflection pattern RP overlaps the non-light emitting region NLA and does not overlap the first pixel region PXA-R. The reflection pattern RP may provide the source light, which has not been converted, to the first light conversion pattern CCF-R again. The light conversion efficiency of the source light is enhanced by this recycling effect of the source light. Unlike an absorption-type light blocking pattern, the reflection pattern RP may not absorb the converted light but provide the light to the front surface of the display device DD. Accordingly, the light emitting efficiency is enhanced.

The organic material pattern MSP may be disposed on the reflection pattern RP. The organic material pattern MSP may include a base resin and an additive. The base resin may be made of various resin compositions. The organic material pattern MSP may include a dye or pigment. The organic material pattern MSP may have a predetermined color by the dye or pigment. The organic material pattern MSP may be black, blue, or red, but is not particularly limited.

The organic material pattern MSP may serve as a mask during a manufacturing process of the reflection pattern RP. The detailed description of the manufacturing process will be described later. Thus, the reflection pattern RP and the organic material pattern MSP may have the same shape in a plan view, and the edge of the reflection pattern RP may be aligned with the edge of the organic material pattern MSP.

A partition wall BW2 (hereinafter, referred to as a second partition wall) of the second pixel region PXA-G, which is adjacent to the first partition wall BW1, may be disposed within the non-light emitting region NLA. The first partition wall BW1 and the second partition wall BW2 are spaced a certain distance from each other. A top surface US, an outer surface OS, and an inner surface may also be defined in the second partition wall BW2 in the same manner as the first partition wall BW1. The reflection pattern RP may be disposed corresponding to the top surface US and the outer surface OS of the first partition wall BW1 and the top surface US and the outer surface OS of the second partition wall BW2, and may have an integrated shape.

The reflection pattern RP may include a first region RP-A1 corresponding to the outer surface OS of the first partition wall BW1 and a second region RP-A2 corresponding to the outer surface OS of the second partition wall BW2. The first region RP-A1 and the second region RP-A2 may be spaced a predetermined distance from each other. The organic material pattern MSP may be disposed in a space between the first region RP-A1 and the second region RP-A2.

A second insulating layer 21 of the light control layer OSL may be disposed on the first insulating layer 11 and the organic material pattern MSP. The second insulating layer 21 may have a refractive index lower than that of the first insulating layer 11. The refractive index of the second insulating layer 21 may be about 1.1 to about 1.5. The refractive index of the second insulating layer 21 may be adjusted by a ratio of hollow inorganic particles and/or voids included in the second insulating layer 21. The second insulating layer 21 may provide the source light and the converted light more vertically.

A third insulating layer 31 of the light control layer OSL may be disposed on the second insulating layer 21. The third insulating layer 31 may be an inorganic layer that seals a structure on the lower side. The third insulating layer 31 may be omitted.

A color filter CF-R (hereinafter, referred to as a first color filter) corresponding to the first pixel region PXA-R is disposed on the third insulating layer 31. The first color filter CF-R may have the second color described above and allows the second color light to be transmitted therethrough. The first color filter CF-R may reduce reflectivity with respect to external light.

The first color filter CF-R may overlap the first pixel region PXA-R, and a portion thereof may overlap the peripheral region NPXA adjacent to the first pixel region PXA-R. The first color filter CF-R may overlap a color filter CF-G (hereinafter, referred to as a second color filter) which corresponds to the neighboring second pixel region PXA-G within the peripheral region NPXA.

The second color filter CF-G may allow third color light, which has been converted in the second pixel region PXA-G, to be transmitted therethrough. The third color light may be green light. The reflectivity of external light is reduced in a region in which the first color filter CF-R overlaps the second color filter CF-G. The region, in which the first color filter CF-R overlaps the second color filter CF-G, may overlap the organic material pattern MSP described above. When the organic material pattern MSP has the first color, the region, in which the first color filter CF-R, the second color filter CF-G, and the organic material pattern MSP overlap each other, may have a function of a black matrix. This is because the region, in which the first color filter CF-R, the second color filter CF-G, and the organic material pattern MSP overlap each other, may absorb all of a red wavelength, a green wavelength, and a blue wavelength of the external light.

A fourth insulating layer 41 of the light control layer OSL is disposed on the first color filter CF-R and the second color filter CF-G. The fourth insulating layer 41 may include an organic layer and provide a flat surface.

FIG. 6B illustrates a first partition wall BW1 that defines a first opening BW-OPR corresponding to the first pixel region PXA-R, a second partition wall BW2 that defines a second opening BW-OPG corresponding to the second pixel region PXA-G, and a third partition wall BW3 that defines a third opening BW-OPB corresponding to the third pixel region PXA-B. The first partition wall BW1, the second partition wall BW2, and the third partition wall BW3 are spaced apart from each other. Unlike that illustrated in FIG. 6B, an additional partition wall, which is connected to the first partition wall BW1, the second partition wall BW2, and the third partition wall BW3, may be further disposed near the first partition wall BW1, the second partition wall BW2, and the third partition wall BW3.

FIG. 6C illustrates the organic material pattern MSP that overlaps the first partition wall BW1, the second partition wall BW2, and the third partition wall BW3. The reflection pattern RP (see FIG. 6A) having the same shape as the organic material pattern MSP is disposed below the organic material pattern MSP.

The organic material pattern MSP and the reflection pattern RP may surround the first opening BW-OPR, the second opening BW-OPG, and the third opening BW-OPB in a plan view. A first opening, a second opening, and a third opening corresponding to the first opening BW-OPR, the second opening BW-OPG, and the third opening BW-OPB may be defined in each of the organic material pattern MSP and the reflection pattern RP. In FIG. 6C, the first opening of the organic material pattern MSP is shown larger than the first opening BW-OPR. The organic material pattern MSP and the reflection pattern RP may be disposed in spaces between the first partition wall BW1, the second partition wall BW2, and the third partition wall BW3.

Referring to FIG. 6D, a main dummy partition wall BW-D may be further disposed in the peripheral region NPXA. The main dummy partition wall BW-D is disposed on both sides of the second partition wall BW2 within the first direction DR1. The main dummy partition wall BW-D overlaps all of the two neighboring unit pixels PXU. The main dummy partition wall BW-D is disposed between the second partition walls BW2 of the two neighboring unit pixels PXU.

The main dummy partition wall BW-D defines a main well MW. The main well MW accommodates a liquid-phase resin composition provided inaccurately during the manufacturing process which will be described later. For example, a liquid-phase resin composition, which has not been accurately provided in the second opening BW-OPG, is accommodated. When the main well 1\4W is not formed in the main dummy partition wall BW-D, the main dummy partition wall BW-D is disposed as an insulating pattern that occupies a predetermined area. The resin composition, which has been provided inaccurately on the insulating pattern, forms a protrusion, and this may cause a defect during the manufacturing process of the display panel.

Referring to FIG. 6D, a sub dummy partition wall BW-SD may be further disposed in the peripheral region NPXA. The sub dummy partition wall BW-SD may connect neighboring partition walls among the first partition wall BW1, the second partition wall BW2, the third partition wall BW3, and the main dummy partition wall BW-D. The sub dummy partition wall BW-SD may connect the first partition wall BW1, the second partition wall BW2, the third partition wall BW3, and the main dummy partition wall BW-D to each other to form a single structure, and thus, durability of the partition structure may be enhanced. The neighboring partition walls among the first partition wall BW1, the second partition wall BW2, the third partition wall BW3, and the main dummy partition wall BW-D and two sub dummy partition walls BW-SD may define a sub well SW. The sub well SW may also accommodate a liquid-phase resin composition provided inaccurately during the manufacturing process which will be described later.

Referring to FIG. 6F, the first insulating layer 11 may be disposed inside the sub well SW. If the liquid-phase resin composition, which has been supplied inaccurately, is supplied to the sub well SW, a resin composition pattern such as the first light conversion pattern CCF-R may be formed inside the sub well SW. A reflection layer RL overlaps the first insulating layer 11. The organic material pattern MSP may overlap the main dummy partition wall BW-D and the main well MW. The first color filter CF-R and the second color filter CF-G may overlap the main well MW.

Figure 7A:
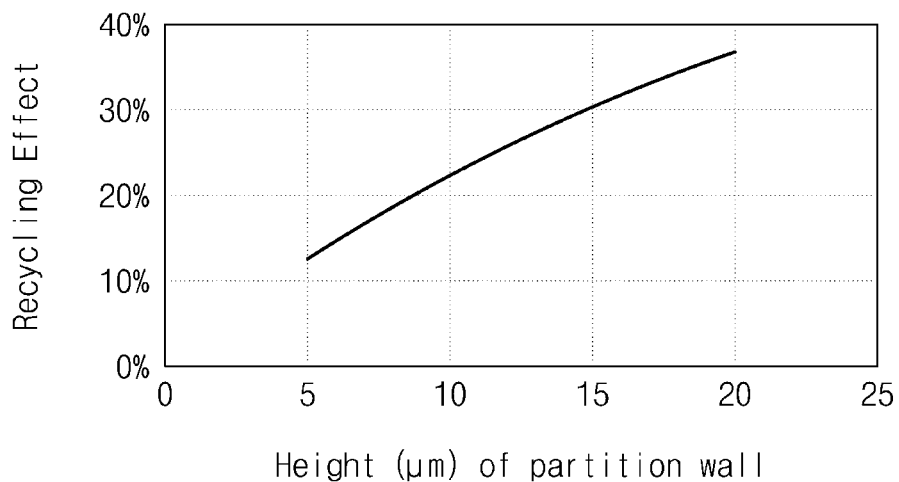
FIGS. 7A and 7B are graphs showing a light recycling effect of the display device according to an embodiment.
Figure 7B:
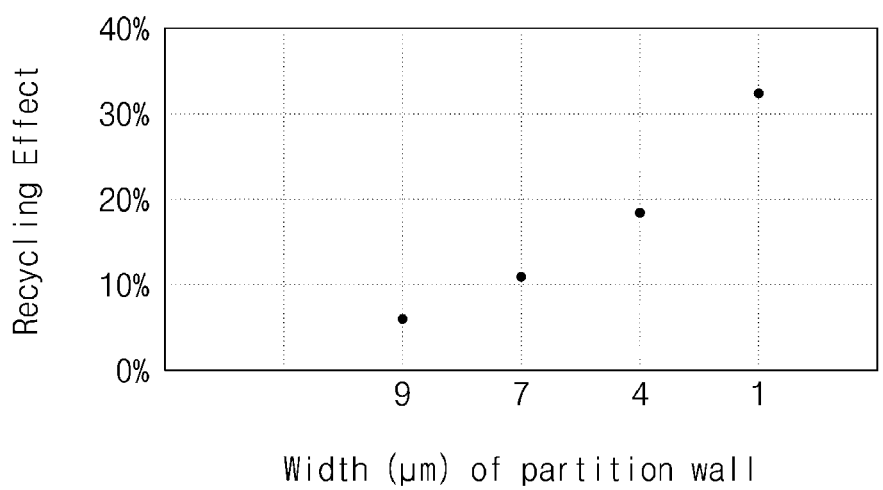

Referring to FIG. 6G, the first insulating layer 11 may be disposed inside the sub well SW. If the liquid-phase resin composition, which has been supplied inaccurately, is supplied to the sub well SW, a resin composition pattern such as the first light conversion pattern CCF-R of FIG. 6A may be formed inside the sub well SW. A reflection layer RL overlaps the first insulating layer 11. The organic material pattern MSP may overlap the sub well SW. The first color filter CF-R and the second color filter CF-G may overlap the sub well SW. FIGS. 7A and 7B are graphs showing a light recycling effect of the display device according to an embodiment of the inventive concept.

Referring to FIG. 7A, the height of the partition wall BW (see FIG. 6A) may be about 5 to about 20 micrometers. The height of the partition wall BW within a range from about 5 to about 20 micrometers is proportional to the light recycling effect. As the height of the partition wall BW increases, the area of the reflection pattern RP (see FIG. 6A) may increase. As the height of the partition wall BW increases, the source light, which has not been converted, may be sufficiently reflected.

FIG. 7B shows a light recycling effect measured with respect to the partition wall BW having the height of about 10 micrometers. The width of the partition wall BW may be about 1 to about 10 micrometers. The width of the partition wall BW within this range is inversely proportional to the light recycling effect. As the width of the partition wall BW decreases, the reflection pattern RP (see FIG. 6A) may be disposed closer to the first pixel region PXA-R (see FIG. 6A). The reflection pattern RP closer to the first pixel region PXA-R may efficiently supply the source light to the light conversion pattern CCF-R.

FIGS. 8A to 8I are cross-sectional views illustrating a method for manufacturing a display device according to an embodiment.

As illustrated in FIG. 8A, a first partition wall BW1 that defines a first opening BW-OPR corresponding to a first light emitting region LA-R, a second partition wall BW2 that defines a second opening BW-OPG corresponding to a second light emitting region LA-G, and a third partition wall BW3 that defines a third opening BW-OPB corresponding to a third light emitting region LA-B are formed on a thin film encapsulation layer TFE of the display panel.

After an organic layer is formed, the organic layer may be patterned through a photolithography process and an etching process. The neighboring partition walls among the first partition wall BW1, the second partition wall BW2, and the third partition wall BW3 may be spaced apart from each other.

As illustrated in FIG. 8B, a first light conversion pattern CCF-R is formed inside the first opening BW-OPR, and a second light conversion pattern CCF-G is formed inside the second opening BW-OPG. A scattering pattern SP is formed inside the third opening BW-OPB.

The first light conversion pattern CCF-R, the second light conversion pattern CCF-G, and the scattering pattern SP may be formed through an inkjet process. A liquid-phase first resin composition in which first quantum dots are mixed is provided inside the first opening BW-OPR, and a liquid-phase second resin composition in which second quantum dots are mixed is provided inside the second opening BW-OPG. The first quantum dots and the second quantum to dots have different light emission wavelengths and thus include different materials. A liquid-phase third resin composition in which scatterers are mixed is provided inside the third opening BW-OPB. The third resin composition may further include dye or pigment of the first color. The first resin composition, the second resin composition, and the third resin composition may be hardened simultaneously.

Figure 8C:
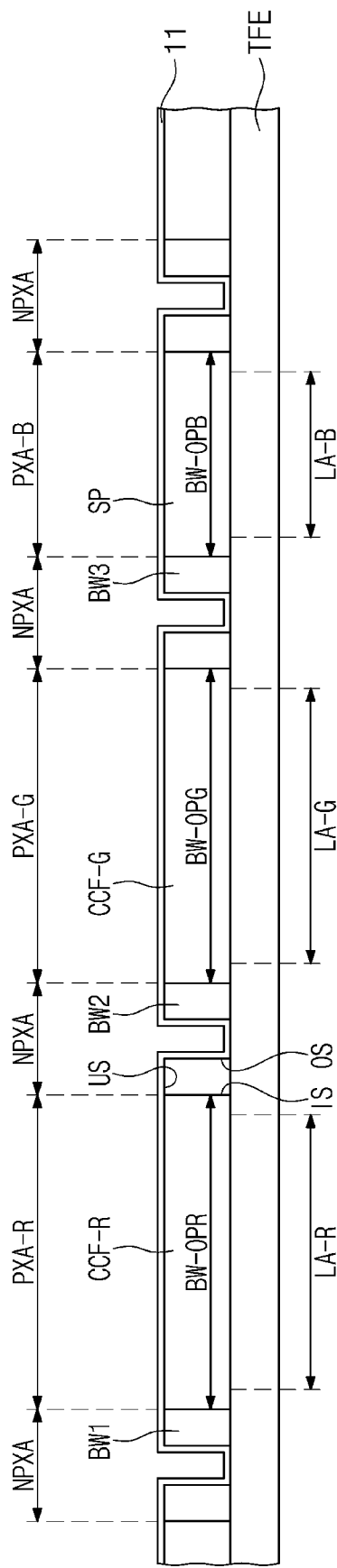

As illustrated in FIG. 8C, a first insulating layer 11 is formed, which covers the first light conversion pattern CCF-R, the second light conversion pattern CCF-G, the scattering pattern SP, the first partition wall BW1, the second partition wall BW2, and the third partition wall BW3. The first insulating layer 11 may be formed through a deposition process of an inorganic material or an organic material. The forming process of the first insulating layer 11 may be omitted.

Figure 8D:
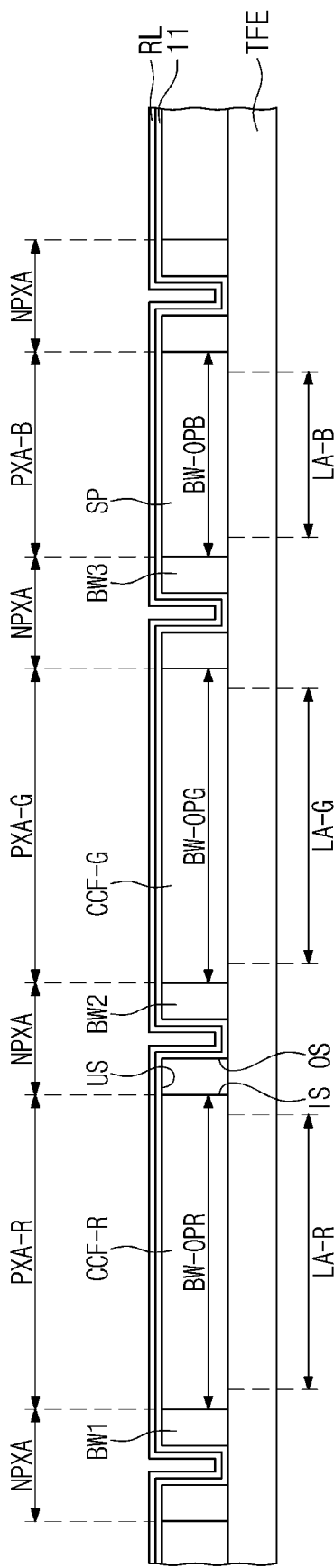

As illustrated in FIG. 8D, a reflection layer RL is formed on the first insulating layer 11. The reflection layer RL includes a metal and may be formed by a sputtering process. The reflection layer RL may be formed so as to correspond to the top surfaces of the light conversion patterns CCF-R and CCF-G, the top surface of the scattering pattern SP, the outer surfaces OS of the partition walls WB1, WB2, and WB3, and the top surfaces US of the partition walls WB1, WB2, and WB3.

Figure 8E:
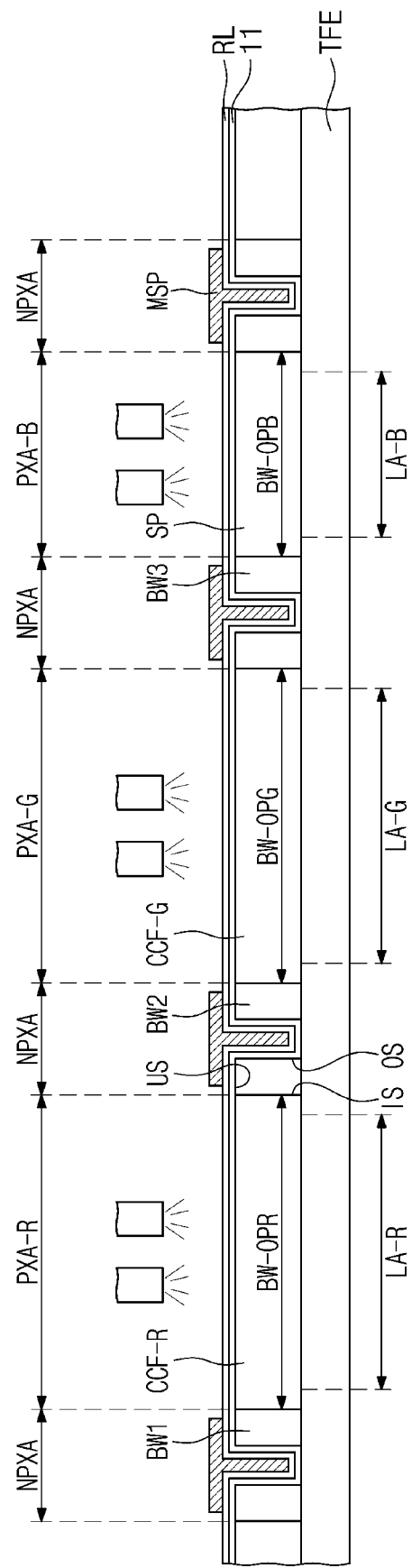

As illustrated in FIG. 8E, a mask pattern MSP is formed on the reflection layer RL. The mask pattern MSP may be an organic material pattern. First, an organic layer is formed so as to correspond to the top surfaces of the light conversion patterns CCF-R and CCF-G, the top surface of the scattering pattern SP, the outer surfaces OS of the partition walls WB1, WB2, and WB3, and the top surfaces US of the partition walls WB1, WB2, and WB3. The organic layer may include dye or pigment. After the organic layer is formed, the organic layer may be patterned through a photolithography process and an etching process. The patterned organic layer may serve as the mask pattern MSP.

As illustrated in FIG. 8E, the reflection layer RL is etched by using the mask pattern MSP. A wet etching process may be performed. An etching solution removes a portion of the reflection layer RL which is exposed from the mask pattern MSP.

Figure 8F:
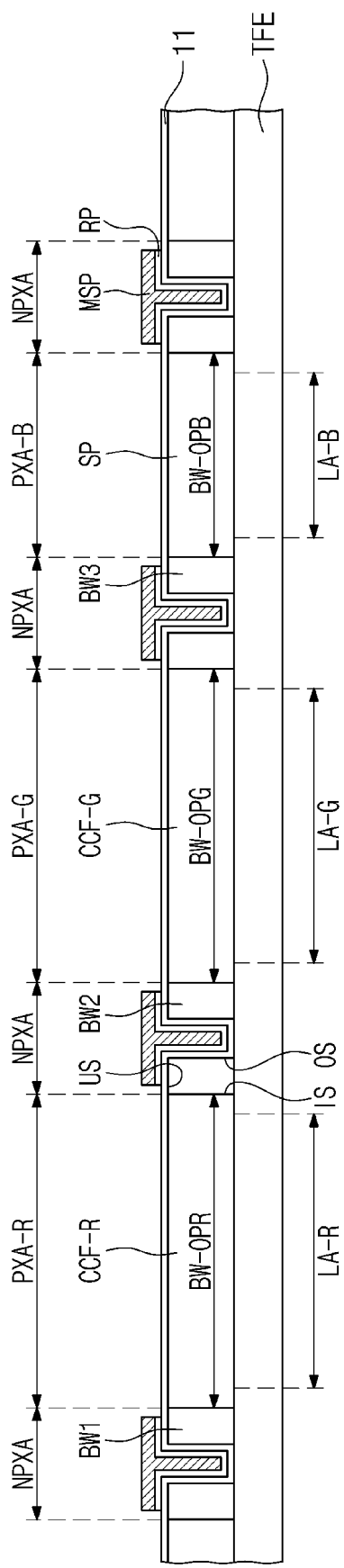

As illustrated in FIG. 8F, a reflection pattern RP having the same shape as the mask pattern MSP in a plan view is formed from the reflection layer RL. The edge of the mask pattern MSP may be aligned with the edge of the reflection pattern RP.

Figure 8G:
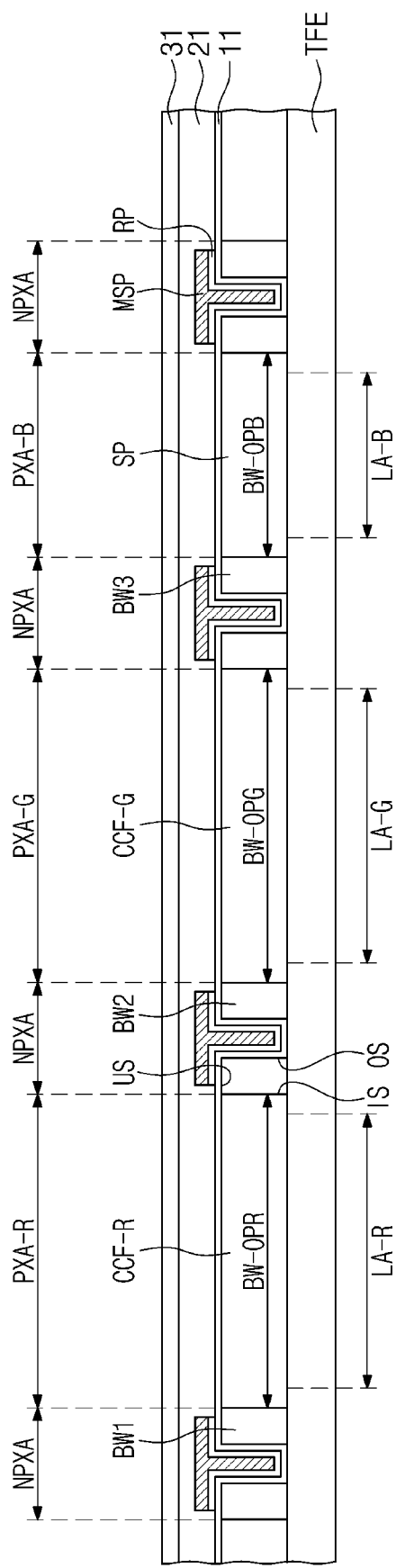

As illustrated in FIG. 8G, a second insulating layer 21 and a third insulating layer 31 may be sequentially formed. The second insulating layer 21 having a low refractive index may be formed by co-depositing hollow inorganic particles and an inorganic material. The third insulating layer 31 may be formed by depositing an inorganic material. Any one of the second insulating layer 21 and the third insulating layer 31 may be omitted.

As illustrated in FIG. 8H, a first color filter CF-R is formed so as to overlap the first pixel region PXA-R. The first color filter CF-R may overlap a peripheral region NPXA. After a first color organic layer including dye or pigment is formed, the first color organic layer may be patterned through a photolithography process and an etching process.

As illustrated in FIG. 8I, a second color filter CF-G is formed so as to overlap the second pixel region PXA-R. The second color filter CF-G may also overlap the peripheral region NPXA. After a second color organic layer including dye or pigment is formed, the second color organic layer may be patterned through a photolithography process and an etching process.

A color filter may not be disposed in the third pixel region PXA-B. The scattering pattern SP includes the first color dye or pigment as described above and thus may have a function of a color filter. The scattering pattern SP may allow the source light to be transmitted therethrough and absorb a portion of the wavelengths of the external light. Consequently, the reflectivity of external light may be reduced.

As illustrated in FIG. 8I, a fourth insulating layer 41 is formed on the first color filter CF-R and the second color filter CF-G. The fourth insulating layer 41 of an organic layer may be formed through an inkjet process.

Figure 9A:
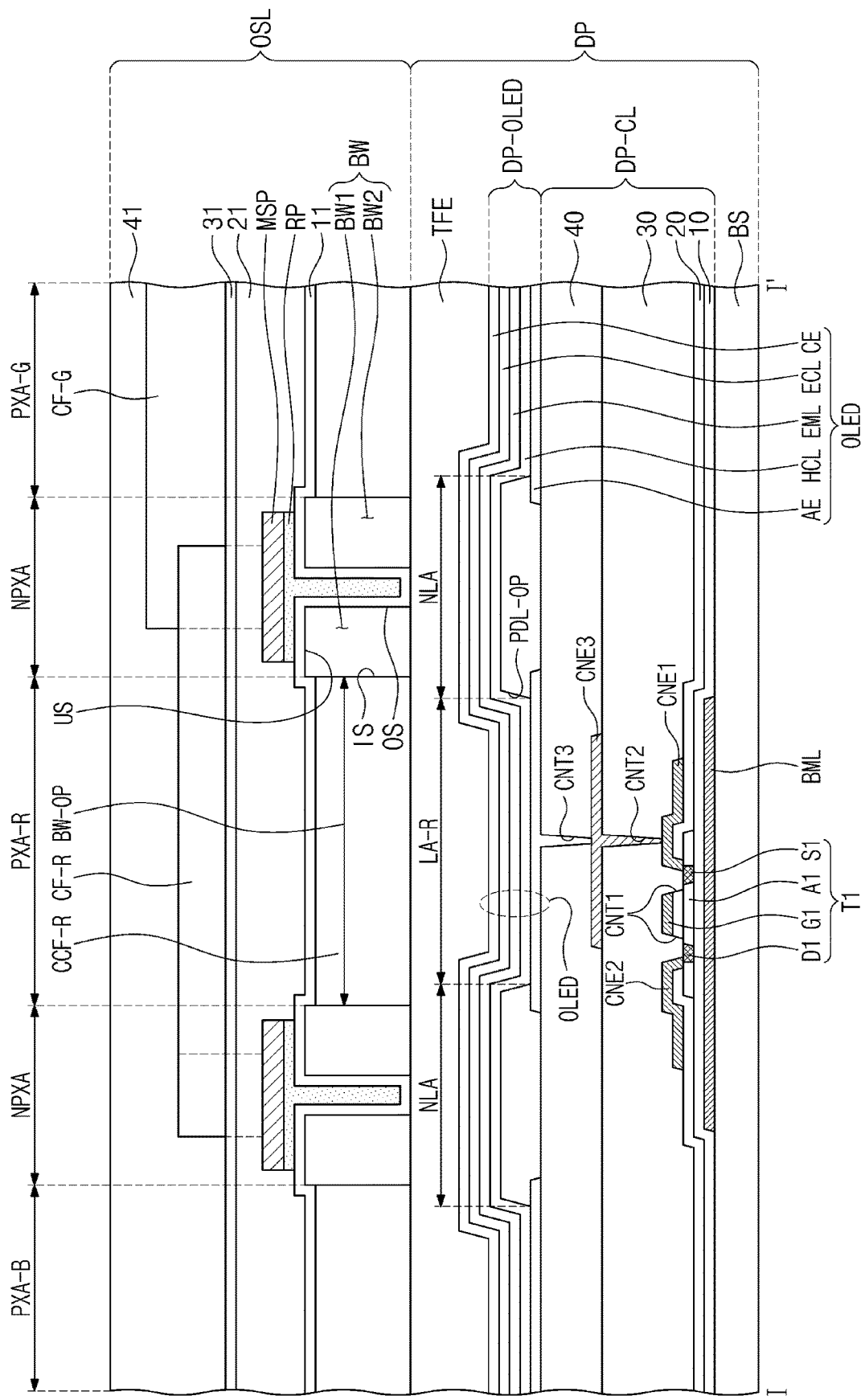
FIGS. 9A and 9B are cross-sectional views of a display device according to an embodiment.
Figure 9B:
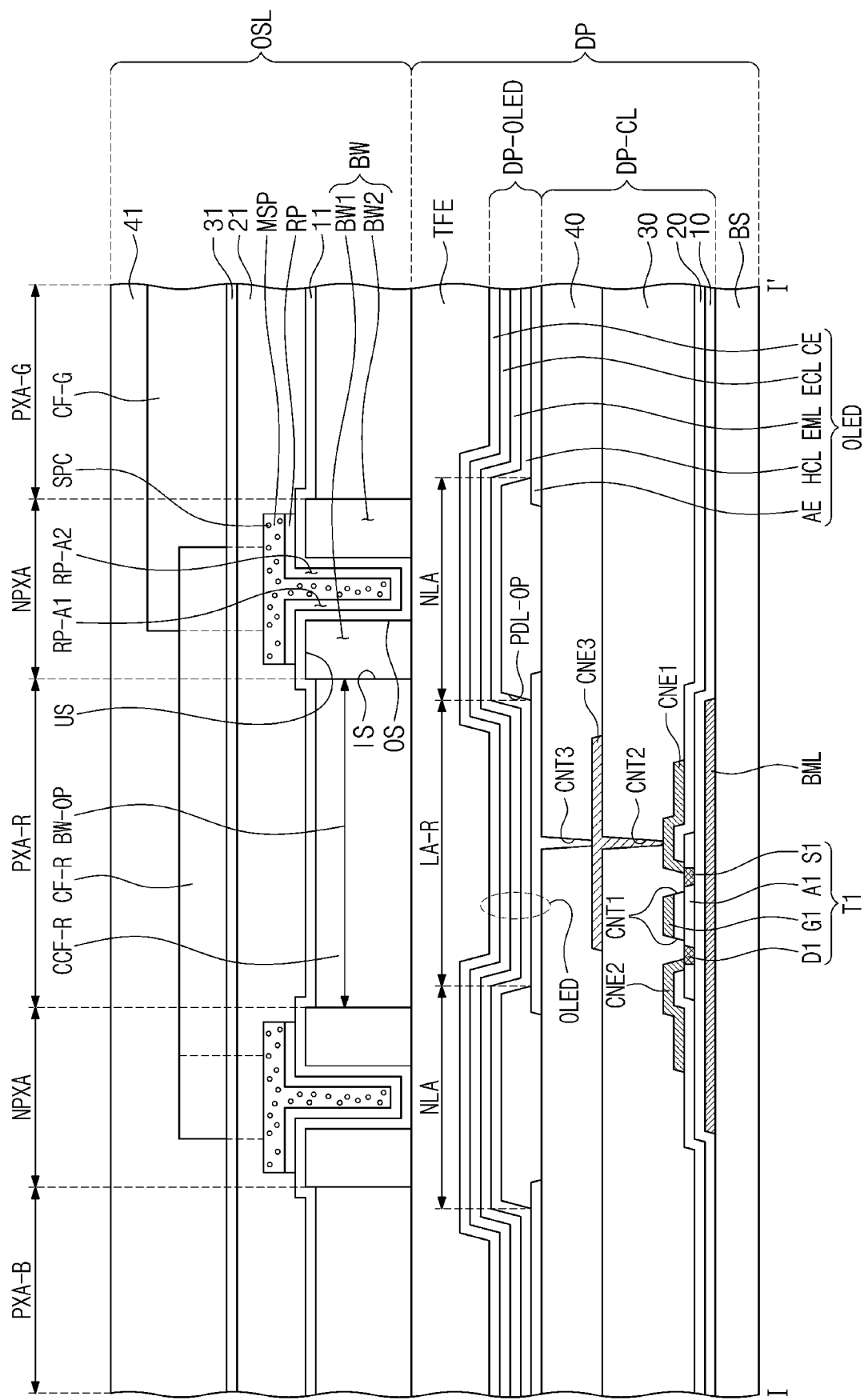

FIGS. 9A and 9B are cross-sectional views of a display device DD according to an embodiment. Hereinafter, detailed description of the same components as those described with reference to FIG. 6A will be omitted for ease in explanation of FIGS. 9A and 9B.

Referring to FIG. 9A, when a gap between partition walls BW1 and BW2 is small, a reflection pattern RP may fill a space between the partition walls BW1 and BW2. An organic material pattern MSP may be disposed only on the top surface of the reflection pattern RP.

Referring to FIG. 9B, an organic material pattern MSP may include an organic material and scattering particles SPC mixed in the organic material. The organic material pattern MSP may not include dye or pigment. The scattering particles SPC of the organic material pattern MSP may scatter the incident light. Accordingly, the first color light, the second color light, and the third color light may be provided in a wide range of viewing angles.

As described above, the reflection pattern is included, and thus, the source light which is not converted may be provided again to the light conversion pattern. The light conversion efficiency of the source light may be enhanced.

Unlike an absorption-type light blocking pattern, the reflection pattern does not absorb the source light or the converted light, but reflects the incident light. The light reflected from the reflection pattern is consequently provided to the front surface of the display device. Accordingly, the light emitting efficiency is enhanced.

The organic material pattern may be used to form the reflection pattern, and also may fill the spaces between the partition walls and prevent color mixing between the neighboring pixel regions. The blue organic material pattern may overlap the red color filter and the green color filter, and thus may have a function of the light blocking pattern. This light blocking pattern may reduce reflectivity of external light.

The light control pattern allowing the source light to be transmitted therethrough may include the dye or pigment having the same color as the source light, and thus may reduce reflectivity of external light.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel comprising a first light emitting region and a second light emitting region, each of which emits first color light;
    a first partition wall that is disposed on the display panel, which allows the first color light to be transmitted therethrough, and has a first opening defined therein and that corresponds to the first light emitting region;
    a first light conversion pattern that is disposed inside the first opening and that converts the first color light into second color light having different color;
    a reflection pattern disposed corresponding to an outer surface of the first partition wall and a top surface of the first partition wall;
    an organic material pattern disposed on the top surface of the first partition wall and disposed on the reflection pattern to overlap the reflection pattern; and a first color filter disposed on the first light conversion pattern and that allows the second color light to be transmitted therethrough.

2. The display device of claim 1, wherein the organic material pattern comprises a base resin and dye or pigment mixed in the base resin.

3. The display device of claim 2, wherein the dye or pigment has the first color.

4. The display device of claim 1, wherein the organic material pattern comprises an organic material and scattering particles mixed in the organic material.

5. The display device of claim 1, further comprising an insulating layer disposed between the first light conversion pattern and the first color filter,
wherein a refractive index of the insulating layer is about 1.1 to about 1.5.

6. The display device of claim 1, further comprising an inorganic layer disposed between the first light conversion pattern and the first color filter and between the first partition wall and the first color filter,
wherein the inorganic layer is in contact with the first light conversion pattern and the first partition wall.

7. The display device of claim 1, wherein an edge of the organic material pattern is aligned with an edge of the reflection pattern.

8. The display device of claim 1, wherein when viewed in a plan view, the reflection pattern surrounds the first opening.

9. The display device of claim 1, wherein the reflection pattern comprises aluminum.

10. The display device of claim 1, further comprising:
a second partition wall that is disposed on the display panel, which allows the first color light to be transmitted therethrough, and that has a second opening defined therein and that corresponds to the second light emitting region;
a second light conversion pattern that is disposed inside the second opening and that converts the first color light into third color light having different color; and
a second color filter disposed on the second light conversion pattern and that allows the third color light to be transmitted therethrough,
wherein the reflection pattern is further disposed on an outer surface of the second partition wall, which faces the outer surface of the first partition wall, and a top surface of the second partition wall, and
the organic material pattern is further disposed on the top surface of the second partition wall.

11. The display device of claim 10, wherein the organic material pattern is disposed between a first region of the reflection pattern, which is disposed on the outer surface of the first partition wall, and a second region of the reflection pattern, which is disposed on the outer surface of the second partition wall.

12. The display device of claim 10, wherein the reflection pattern fills a space defined by the outer surface of the first partition wall and the outer surface of the second partition wall.

13. The display device of claim 10, wherein the first color filter and the second color filter overlap each other on the organic material pattern.

14. The display device of claim 1, comprising:
a second partition wall that is disposed on the display panel, which allows the first color light to be transmitted therethrough, and that has a second opening defined therein and that corresponds to the second light emitting region; and
a light control pattern that is disposed inside the second opening and that comprises scattering particles that scatter the first color light,
wherein the reflection pattern is further disposed on an outer surface of the second partition wall, which faces the outer surface of the first partition wall, and a top surface of the second partition wall, and
the organic material pattern is further disposed on the top surface of the second partition wall.

15. The display device of claim 14, wherein the light control pattern comprises an organic material and dye or pigment mixed in the organic material,
wherein the dye or pigment has the first color.

16. A method for manufacturing a display device, the method comprising:
forming a first partition wall on a first light emitting region of a display panel which emits first color light, wherein the first partition wall has a first opening defined therein and corresponding to the first light emitting region;
forming a first light conversion pattern inside the first opening, wherein the first light conversion pattern converts the first color light into second color light having different color;
forming a reflection layer to correspond to a top surface of the first light conversion pattern, an outer surface of the first partition wall, and a top surface of the first partition wall; and
forming a mask pattern to overlap a first region of the reflection layer corresponding to the outer surface of the first partition wall and a second region of the reflection layer corresponding to the top surface of the first partition wall; and
etching the reflection layer by using the mask pattern so that a reflection pattern is formed from the reflection layer.

17. The method of claim 16, wherein, prior to forming the reflection layer, the method further comprises forming an inorganic layer, which is in contact with the top surface of the first light conversion pattern, the top surface of the first partition wall, and the outer surface of the first partition wall.

18. The method of claim 16, further comprising forming a color filter to overlap the first light conversion pattern,
wherein the color filter allows the second color light to be transmitted therethrough.

19. The method of claim 16, further comprising forming an insulating layer to overlap the first light conversion pattern,
wherein the insulating layer has a refractive index of about 1.1 to about 1.5.

20. The method of claim 16, wherein the mask pattern comprises an organic material and dye or pigment or scattering particles mixed in the organic material.

* * * * *